United States Patent
Cabot et al.

(10) Patent No.: US 11,002,796 B2
(45) Date of Patent: May 11, 2021

(54) TESTING DEVICE

(71) Applicant: MILWAUKEE ELECTRIC TOOL CORPORATION, Brookfield, WI (US)

(72) Inventors: Benjamin Oliver Ryan Cabot, Milwaukee, WI (US); Gareth Mueckl, Milwaukee, WI (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 142 days.

(21) Appl. No.: 16/021,149

(22) Filed: Jun. 28, 2018

(65) Prior Publication Data

US 2018/0321297 A1    Nov. 8, 2018

Related U.S. Application Data

(63) Continuation of application No. 15/074,070, filed on Mar. 18, 2016, now Pat. No. 10,024,902.

(60) Provisional application No. 62/287,988, filed on Jan. 28, 2016, provisional application No. 62/134,651, filed on Mar. 18, 2015, provisional application No. 62/134,649, filed on Mar. 18, 2015, provisional application No. 62/134,650, filed on Mar. 18, 2015.

(51) Int. Cl.
*G01R 31/50* (2020.01)
*G01R 31/327* (2006.01)
*G06F 11/22* (2006.01)
*G01R 31/69* (2020.01)

(52) U.S. Cl.
CPC ......... *G01R 31/50* (2020.01); *G01R 31/3277* (2013.01); *G06F 11/221* (2013.01); *G01R 31/69* (2020.01)

(58) Field of Classification Search
CPC ...... G01R 31/02; G01R 31/04; G01R 31/024; G01R 31/025; G01R 31/026; G01R 31/281; G01R 31/045; G01R 22/068; G01R 31/327; G06F 11/221; G06F 11/07
See application file for complete search history.

(56) References Cited

U.S. PATENT DOCUMENTS

| | | | |
|---|---|---|---|
| 6,982,558 | B2 | 1/2006 | Bryndzia et al. |
| 7,068,038 | B2 | 6/2006 | Mason et al. |

(Continued)

FOREIGN PATENT DOCUMENTS

| | | |
|---|---|---|
| CN | 2689345 | 3/2005 |
| CN | 102818727 | 12/2012 |

OTHER PUBLICATIONS

Chinese Patent Office Action for Application No. 201680028799.2 dated Jul. 2, 2019 (8 pages, statement of relevance included).

(Continued)

*Primary Examiner* — Son T Le
(74) *Attorney, Agent, or Firm* — Michael Best & Friedrich LLP

(57) ABSTRACT

A testing device including a housing including an indicator, a main housing, and a probe housing, wherein the probe housing is rotatably coupled to the main housing. The testing device further includes a first test probe and a second test probe. The first test probe is coupled to the main housing. The first test probe is configured to be inserted into an alternating-current receptacle. The second test probe is coupled to the probe housing. The second test probe is configured to be inserted into a universal serial bus receptacle.

20 Claims, 18 Drawing Sheets

(56) References Cited

U.S. PATENT DOCUMENTS

| | | | |
|---|---|---|---|
| 7,091,723 B2 | 8/2006 | Simmons et al. | |
| 7,259,567 B2 | 8/2007 | Sears et al. | |
| 8,866,485 B1 | 10/2014 | Lacey et al. | |
| 2002/0089334 A1 | 7/2002 | Lee et al. | |
| 2007/0136025 A1* | 6/2007 | Lo | G01R 31/31715 702/122 |
| 2008/0140565 A1* | 6/2008 | DeBenedetti | G06Q 20/10 705/39 |
| 2012/0153993 A1 | 6/2012 | Xie et al. | |
| 2012/0170342 A1* | 7/2012 | Manning | H05K 5/0278 363/146 |
| 2012/0276763 A1 | 11/2012 | Quezada | |
| 2012/0292991 A1 | 11/2012 | Dodal et al. | |
| 2013/0127445 A1 | 5/2013 | Yuan et al. | |
| 2013/0151898 A1 | 6/2013 | Gorecha et al. | |
| 2014/0266287 A1 | 9/2014 | Reeder, III | |
| 2016/0179153 A1 | 6/2016 | Cohen et al. | |
| 2016/0204816 A1* | 7/2016 | Abramovich | H04B 1/3888 455/575.8 |

OTHER PUBLICATIONS

International Search Report and Written Opinion for Application No. PCT/US2016/023096 dated Jun. 27, 2016 (12 pages).
European Patent Office Search Report for Application No. 16765814.5 dated Nov. 6, 2018, 9 pages.
Chinese Patent Office Action for Application No. 201680028799.2 dated Mar. 13, 2020 (7 pages including statement of relevance).

* cited by examiner

US 11,002,796 B2

TESTING DEVICE

RELATED APPLICATIONS

The present application is a continuation of U.S. patent application Ser. No. 15/074,070, filed Mar. 18, 2016, now U.S. Pat. No. 10,024,902, which claims priority to U.S. Provisional Application No. 62/134,649, filed Mar. 18, 2015, U.S. Provisional Application No. 62/134,650, filed Mar. 18, 2015, U.S. Provisional Application No. 62/134,651, filed Mar. 18, 2015, and U.S. Provisional Application No. 62/287,988, filed Jan. 28, 2016, the entire contents of which are hereby incorporated.

FIELD

Embodiments relate to a testing device.

SUMMARY

The invention described herein relates to a testing device for testing a receptacle, an outlet, and/or a wire. One embodiment provides a testing device including a housing including an indicator, a main housing, and a probe housing, wherein the probe housing is rotatably coupled to the main housing. The testing device further includes a first test probe and a second test probe. The first test probe is coupled to the main housing. The first test probe is configured to be inserted into an alternating-current receptacle. The second test probe is coupled to the probe housing. The second test probe is configured to be inserted into a universal serial bus receptacle.

Another embodiment provides a method of testing an alternating-current voltage and a universal serial bus voltage. The method includes providing a housing including an indicator, a main housing, and a probe housing, wherein the probe housing is rotatably coupled to the main housing. The method further includes receiving, via a first input located at the main housing, the alternating-current voltage; and receiving, via a second input located at the probe housing, the universal serial bus voltage.

Another embodiment provides a testing device including a housing having an indicator, a first test probe, a second test probe, a first test circuit located within the housing, and a second test circuit located within the housing. The first test probe is coupled to the housing and is configured to be inserted into an alternating-current (AC) receptacle. The second test probe is coupled to the housing and is configured to be inserted into a universal serial bus (USB) receptacle. The first test circuit is coupled to the first test probe and is configured to receive, via the first test probe, an alternating-current voltage from the alternating-current receptacle, perform a first test on the alternating-current voltage, and output a first signal to the indicator based on the first test. The second test circuit is electrically coupled to the second test probe and is configured to receive, via the second test probe, a universal serial bus voltage from the universal serial bus receptacle, perform a second test on the universal serial bus voltage, and output a second signal to the indicator based on the second test.

Yet another embodiment provides a method of testing an alternating-current (AC) voltage and a universal serial bus (USB) voltage. The method includes receiving, via a first input, the alternating-current voltage and receiving, via a second input, the universal serial bus voltage. The method further includes performing a first test on the alternating-current voltage and performing a second test on the universal serial bus voltage. The method further includes outputting, to an indicator, a first signal based on the first test and outputting, to the indicator, a second signal based on the second test.

Other aspects of the invention will become apparent by consideration of the detailed description and accompanying drawings.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

DETAILED DESCRIPTION

Figure 1A:
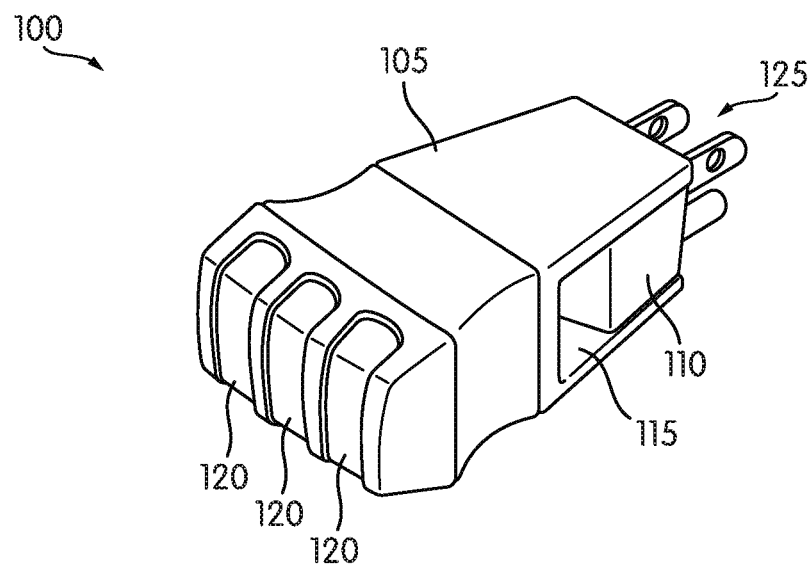
FIG. 1A illustrates a testing device in a first configuration according to an embodiment of the invention.
Figure 1B:
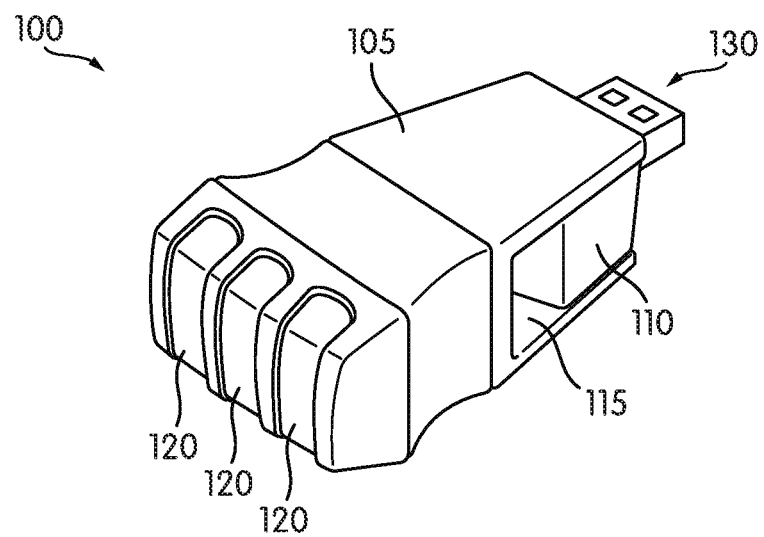
FIG. 1B illustrates the testing device of FIG. 1A in a second configuration.

FIGS. 1A and 1B illustrate a testing device 100 according to a first embodiment of the invention. The testing device 100 includes a main housing 105, a rotatable probe housing 110, a recess 115, a plurality of indicators 120 (e.g., LEDs), an AC test probe 125, and a USB test probe 130. The main housing 105 is operable or configured to be gripped by a user, and the AC test probe 125 or USB test probe 130 can be inserted into a receptacle or outlet in order to perform one or more tests. For example, when the AC test probe 125 is inserted into an AC power outlet, the testing device 100 is operable or configured to test for a variety of fault conditions associated with the outlet. The fault conditions include an open ground, an open neutral, an open hot, a hot/ground reverse, a hot neutral reverse, etc. The testing device 100 evaluates the outlet wiring to identify a fault condition. If a fault condition is identified, the indicators 120 are illuminated accordingly. For example, one or more of the indicators 120 are illuminated to indicate each type of potential fault. The indicators 120 can also be illuminated to indicate that the outlet is wired properly and that no faults were identified. In some embodiments, the indicators 120 can be accompanied by, or replaced with, an audible indicator that generates a tone (or sequence of tones) indicative of a detected fault condition. In some embodiments, the testing device 200 operates to test an AC power outlet in a manner similar to outlet tester disclosed in U.S. Pat. No. 5,625,285, entitled "AC POWER OUTLET GROUND INTEGRITY AND WIRE TEST CIRCUIT DEVICE," the entire content of which is hereby incorporated by reference. Although illustrated as a three-prong AC plug for use in the United States, in other embodiments, AC test probe 125 may be a European AC plug (e.g., a two-pin or three-pin plug following CEE standards used with approximately 230V).

The USB test probe 130 is operable or configured to detect the presence of a USB voltage (e.g., approximately 5V DC, approximately 12 VDC, approximately 20 VDC, etc.) present at a USB receptacle or outlet. Although illustrated as being configured to be inserted into a USB 1.x (e.g., USB 1.0), USB 2.0, or USB 3.x (e.g., USB 3.0) receptacle, in other embodiments, USB test probe 130 may be configured to be inserted into a variety of USB receptacles, including but not limited to, a USB Type-A receptacle, a USB Type-B receptacle, a USB Type-C receptacle, a min-A receptacle, a mini-AB receptacle, a micro-AB receptacle, a micro-B receptacle, a micro-B SuperSpeed receptacle, a mini-B receptacle, and a UC-E6 receptacle. The presence of the USB voltage at the receptacle indicates a sufficient voltage is present to charge a USB device using the receptacle. The USB voltage can be detected using, for example, a voltage divider circuit, a comparator, etc.

The recess 115 is sized such that it is capable of receiving either the AC test probe 125 or the USB test probe 130 when either test probe is stowed in a non-use position within the recess 115 (e.g., is incapable of being inserted into a corresponding receptacle). The probe housing 110 is rotatably coupled to the main housing 105 (e.g., in a manner similar to that illustrated in FIG. 2C). The AC test probe 125 and the USB test probe 130 are mounted to, or integral with, the probe housing 110. In some embodiments, the probe housing 110 is able to rotate 360° with respect to the main housing 105. In other embodiments, the probe housing 110 is able to rotate less than 360° with respect to the main housing 105. For example, the probe housing 110 can rotate approximately 180° with respect to the main housing 105 to switch between the AC test probe 125 and the USB test probe 130 being in a use position (e.g., capable of being inserted into a corresponding receptacle) and the non-use position. The probe housing 110 and/or the main housing 105 can include one or more detents or flanges that limit or stop the rotation of the probe housing 110 with respect to the main housing 105 (e.g., to prevent wires within the testing device 100 from becoming tangled or twisted). In some embodiments, the probe housing 110 uses an interference or friction fit to secure the AC test probe 125 or the USB test probe 130 into the use position. The force required to overcome the interference or friction fit is sufficient to prevent the probe housing 110 from rotating with respect to the main housing 105 without the application of an external force (e.g., from a user).

Figure 2A:
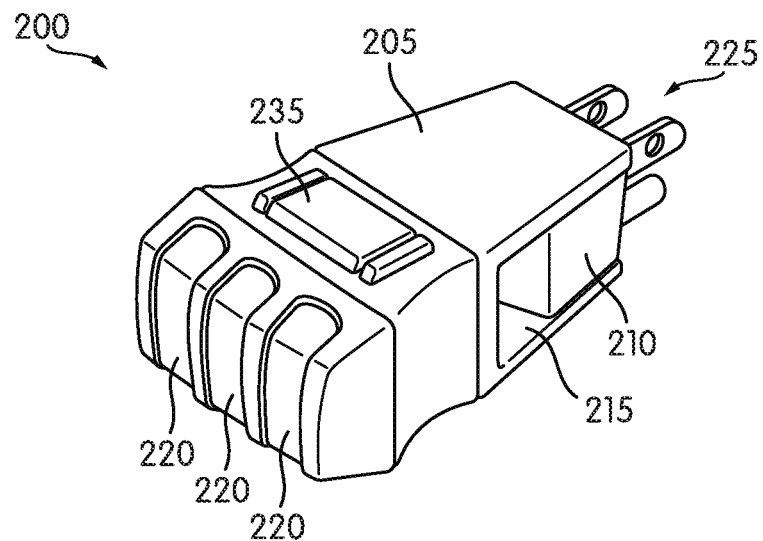
FIG. 2A illustrates a testing device in a first configuration according to another embodiment of the invention.
Figure 2B:
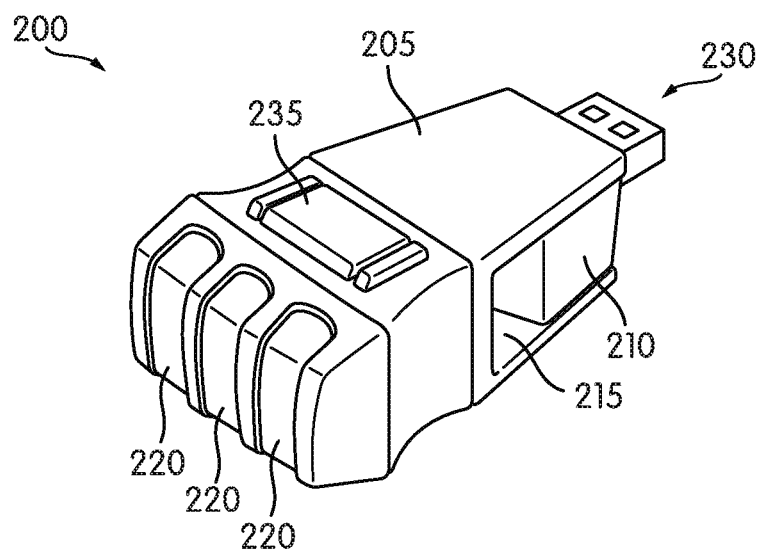
FIG. 2B illustrates the testing device of FIG. 2A in a second configuration.

FIGS. 2A and 2B illustrate a testing device 200 according to a second embodiment of the invention. The testing device 200 includes a main housing 205, a rotatable probe housing 210, a recess 215, a plurality of indicators 220, an AC test probe 225, a USB test probe 230, and a ground fault circuit interrupt ("GFCI") test button 235. The main housing 205 is operable or configured to be gripped by a user, and the AC test probe 225 or USB test probe 230 can be inserted into a receptacle or outlet in order to perform one or more tests. For example, when the AC test probe 225 is inserted into an AC power outlet, the testing device 200 is operable or configured to test for a variety of fault conditions associated with the outlet. The fault conditions include an open ground, an open neutral, an open hot, a hot/ground reverse, a hot neutral reverse, etc. The testing device 200 evaluates the outlet wiring to identify a fault condition. If a fault condition is identified, the indicators 220 are illuminated accordingly. For example, one or more of the indicators 220 are illuminated to indicate each type of potential fault. The indicators 220 can also be illuminated to indicate that the outlet is wired properly and that no faults were identified. In some embodiments, the indicators 220 can be accompanied by, or replaced with, an audible indicator that generates a tone (or sequence of tones) indicative of a detected fault condition. In some embodiments, the testing device 200 operates to test an AC power outlet in a manner similar to outlet tester disclosed in U.S. Pat. No. 5,625,285, entitled "AC POWER OUTLET GROUND INTEGRITY AND WIRE TEST CIRCUIT DEVICE," the entire content of which was previously incorporated by reference. Although illustrated as a three-prong AC plug for use in the United States, in other embodiments, AC test probe 225 may be a European AC plug (e.g., a two-pin or three-pin plug following CEE standards used with approximately 230V).

The USB test probe 230 is operable or configured to detect the presence of a USB voltage (e.g., 5V DC) present at a USB receptacle or outlet. In some embodiments, detecting the presence of a USB voltage present at the USB receptacle or outlet includes determining that the USB voltage is within a range. In such an embodiment, the range may be approximately 4.75V DC to 5.25V DC. The presence of the USB voltage at the receptacle indicates a sufficient voltage is present to charge a USB device using the receptacle. The USB voltage can be detected using, for example, a voltage divider circuit, a comparator, etc.

The GFCI test button 235 is used to initiate a GFCI test. After ensuring that a powered outlet is wired properly, the AC test probe 225 can be inserted into the GFCI outlet. A user can then activate the GFCI test button 235. If a GFCI outlet is operating correctly, the GFCI test should cause the outlet to trip into an off state. In some embodiments, the testing device 200 operates to test a GFCI outlet in a manner similar to the outlet tester disclosed in U.S. Pat. No. 5,642,052, entitled "HAND-HELD TESTER FOR RECEPTACLE GROUND FAULT CIRCUIT INTERRUPTERS," the entire content of which is hereby incorporated by reference.

Figure 2C:
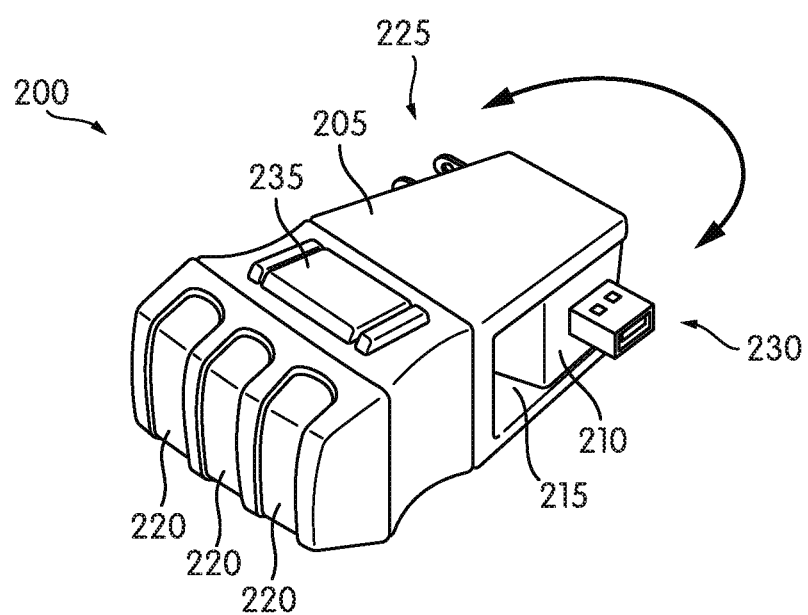
FIG. 2C illustrates the testing device of FIG. 2A transitioning from the first configuration of FIG. 2A to the second configuration of FIG. 2B.

The recess 215 is sized such that it is capable of receiving either the AC test probe 225 or the USB test probe 230 when either test probe is stowed in a non-use position within the recess 215 (e.g., is incapable of being inserted into a corresponding receptacle). The probe housing 210 is rotatably coupled to the main housing 205 as shown in FIG. 2C. The AC test probe 225 and the USB test probe 230 are mounted to, or integral with, the probe housing 210. In some embodiments, the probe housing 210 is able to rotate 360° with respect to the main housing 205. In other embodiments, the probe housing 210 is able to rotate less than 360° with respect to the main housing 205. For example, the probe housing 210 can rotate approximately 180° with respect to the main housing 205 to switch between the AC test probe 225 and the USB test probe 230 being in a use position (e.g., capable of being inserted into a corresponding receptacle) and the non-use position. The probe housing 210 and/or the main housing 205 can include one or more detents or flanges that limit or stop the rotation of the probe housing 210 with respect to the main housing 205 (e.g., to prevent wires within the testing device 200 from becoming tangled or twisted). In some embodiments, the probe housing 210 uses an interference or friction fit to secure the AC test probe 225 or the USB test probe 230 into the use position. The force required to overcome the interference or friction fit is sufficient to prevent the probe housing 210 from rotating with respect to the main housing 205 without the application of an external force (e.g., from a user).

Figure 3A:
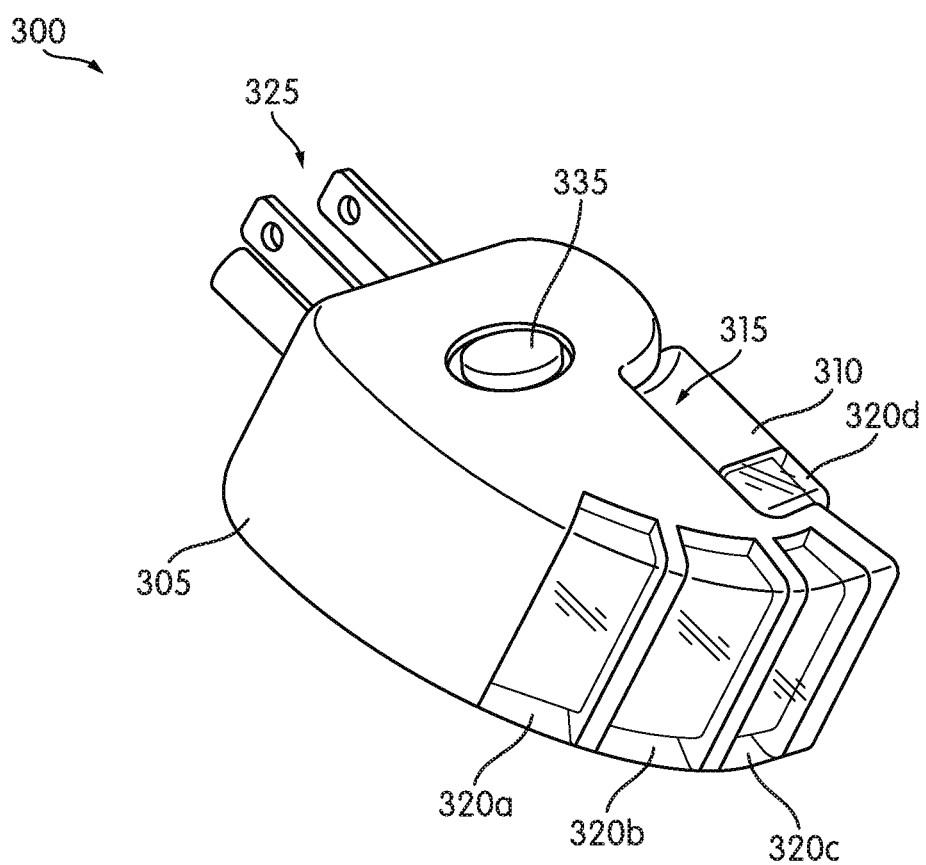
FIG. 3A illustrates a testing device in a first configuration according to another embodiment of the invention.
Figure 3B:
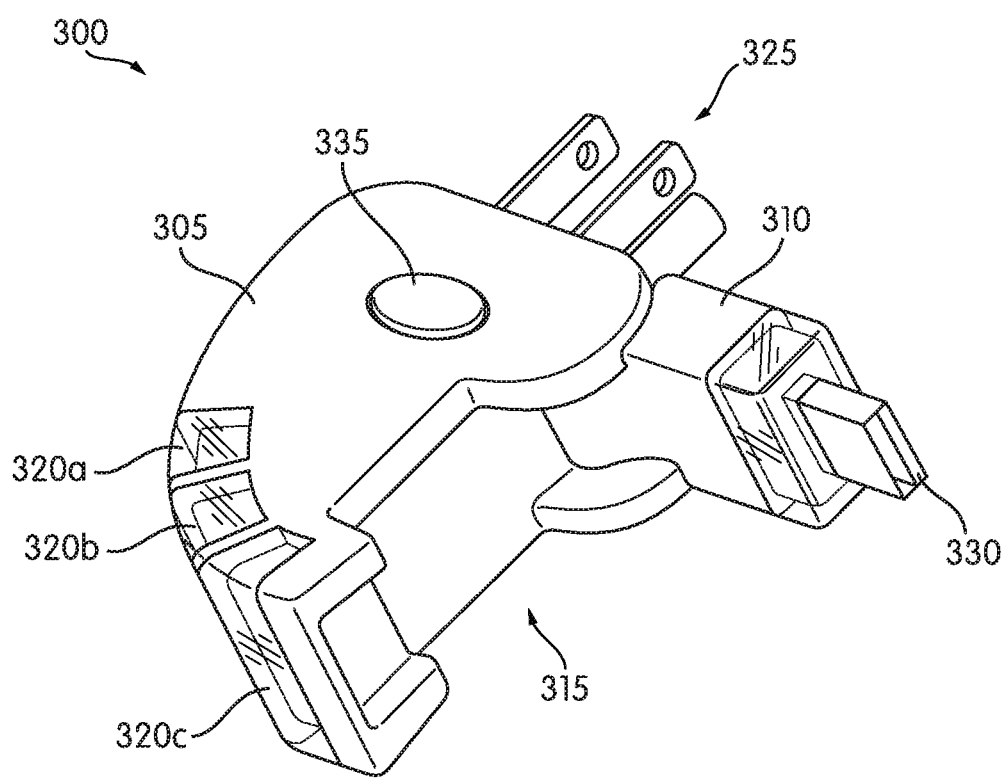
FIG. 3B illustrates the testing device of FIG. 3A in a second configuration according to another embodiment of the invention.
Figure 3C:
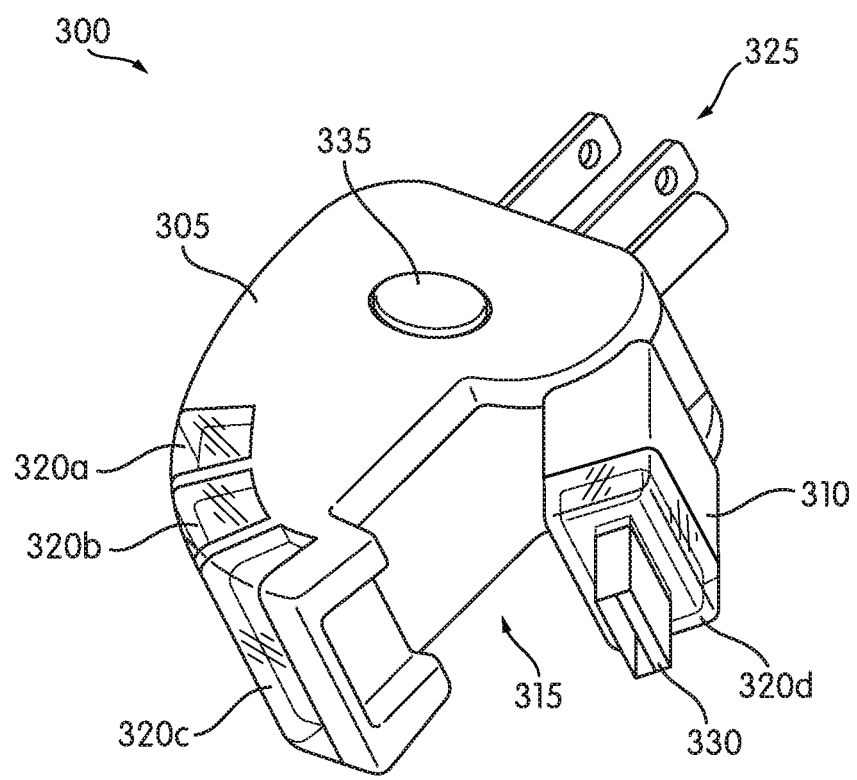
FIG. 3C illustrates the testing device of FIG. 3A in a third configuration according to another embodiment of the invention.

FIGS. 3A-3C illustrate a testing device 300 according to another embodiment of the invention. The testing device 300 includes a main housing 305, a rotatable probe housing 310, a recess 315, indicators 320a-320d, an AC test probe 325, a USB test probe 330 (FIGS. 3B & 3C), and a GFCI test button 335. The main housing 305 is operable to be gripped by a user. In some embodiments, the AC test probe 325 or the USB test probe 330 can be inserted into a receptacle or outlet in order to perform one or more tests similar to those described above with respect to testing device 100/200. In some embodiments, as described in more detail below, indicators 320a-320c are configured to output indications to the user corresponding to one or more tests performed using the AC test probe 325, while indicator 320d is configured to output an indication corresponding to one or more tests performed using the USB test probe 330. Although illustrated as a three-prong AC plug for use in the United States, in other embodiments, AC test probe 325 may be a European AC plug (e.g., a two-pin or three-pin plug following CEE standards used with approximately 230V).

FIG. 3A illustrates the testing device 300 in a first, or closed, configuration. In the first configuration, the rotatable probe housing 310 is positioned within the recess 315, and therefore in a non-use position (e.g. incapable of being inserted into a corresponding receptacle). In the first configuration, AC test probe 325 may still be used (e.g., capable of being inserted into a corresponding receptacle for testing purposes). Similar to the testing device 100/200, the probe housing 310 and/or the main housing 305 can include one or more detents or flanges that limit or stop the rotation of the probe housing 310 out of the recess 315. In some embodiments, the probe housing 310 uses an interference or friction fit to secure the probe housing 310 within the recess 315. The force required to overcome the interference or friction fit is sufficient to prevent the probe housing 310 from rotating with respect to the main housing 305 without the application of an external force (e.g., from a user).

FIG. 3B illustrates the testing device 300 in a second, or open, configuration. In the second configuration, the rotatable probe housing 310 is positioned out of the recess, and therefore in a use-position (e.g., capable of being inserted into a corresponding receptacle). In the second configuration, either the AC test probe 325 or the USB test probe 330 may be used. FIG. 3C illustrates the testing device 300 in a third, or intermediary, configuration. When in the third configuration, the rotatable probe housing 310 is between the first configuration and the second configuration.

Figure 4:
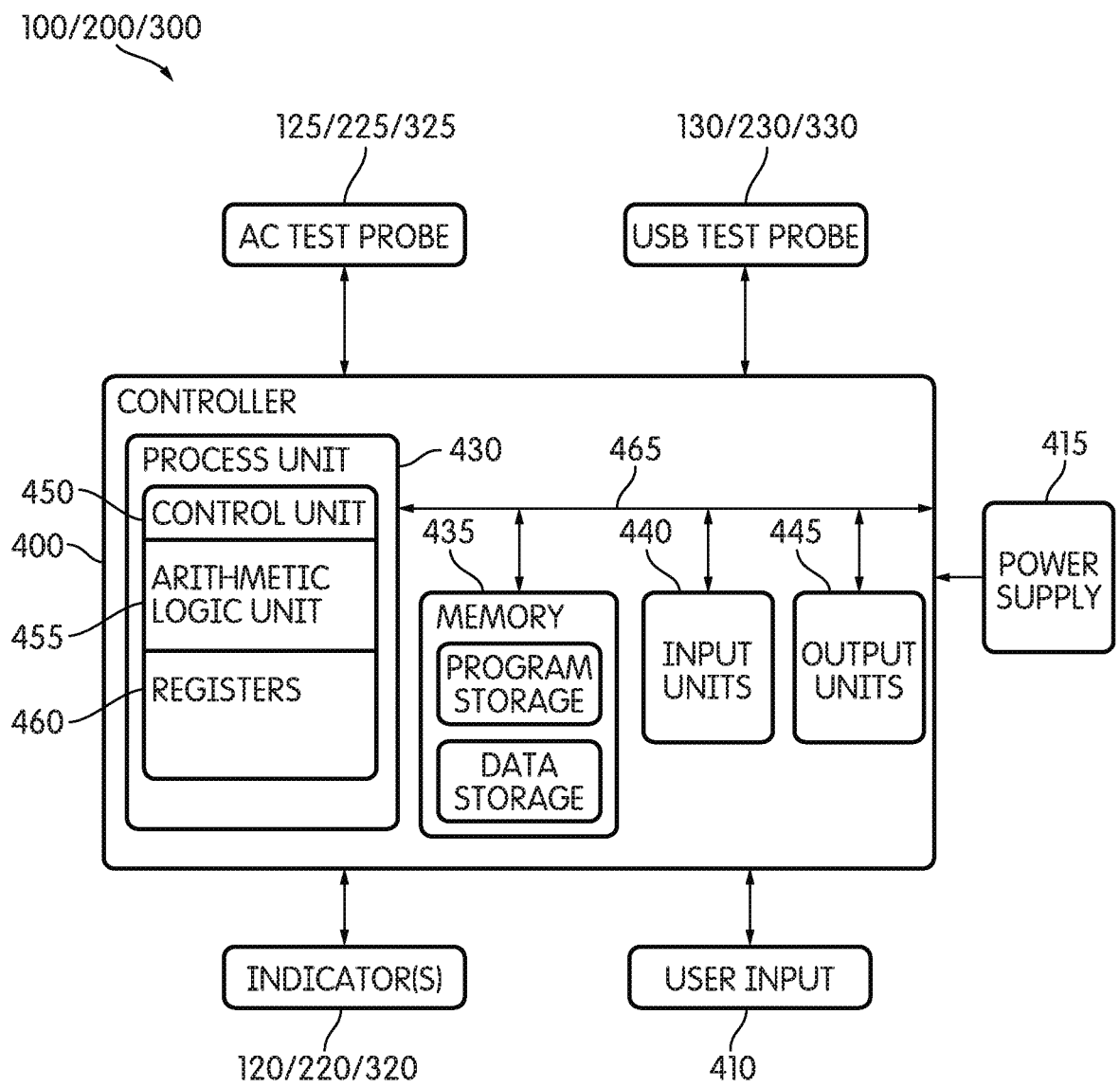
FIG. 4 illustrates a block diagram of the testing device according to an embodiment of the invention.

FIG. 4 illustrates a controller 400 associated with the testing device 100 of FIGS. 1A and 1B, the testing device 200 of FIGS. 2A and 2B, or the testing device 300 of FIGS. 3A-3C. The controller 400 is electrically and/or communicatively connected to a variety of modules or components of the testing device 100/200/300. For example, the illustrated controller 400 is connected to, a user input module 410, a power supply module 415, one or more indicators 120/220/320, the AC test probe 125/225/325, and the USB test probe 130/230/330. The controller 400 includes combinations of hardware and software that are operable or configured to, among other things, control the operation of the testing device, activate the one or more indicators 120/220/320 (e.g., LEDs), etc.

In some embodiments, the controller 400 includes a plurality of electrical and electronic components that provide power, operational control, and protection to the components and modules within the controller 400 and/or testing device 100/200/300. For example, the controller 400 includes, among other things, a processing unit 430 (e.g., a microprocessor, a microcontroller, or another suitable programmable device), a memory 435, input units 440, and output units 445. The processing unit 430 includes, among other things, a control unit 450, an arithmetic logic unit ("ALU") 455, and a plurality of registers 460 (shown as a group of registers in FIG. 4), and is implemented using a known computer architecture, such as a modified Harvard architecture, a von Neumann architecture, etc. The processing unit 430, the memory 435, the input units 440, and the output units 445, as well as the various modules connected to the controller 400 are connected by one or more control and/or data buses (e.g., common bus 465). The control and/or data buses are shown generally in FIG. 4 for illustrative purposes. The use of one or more control and/or data buses for the interconnection between and communication among the various modules and components would be known to a person skilled in the art in view of the invention described herein.

The memory 435 includes, for example, a program storage area and a data storage area. The program storage area and the data storage area can include combinations of different types of memory, such as read-only memory ("ROM"), random access memory ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, or electronic memory devices. The processing unit 430 is connected to the memory 435 and executes software instructions that are capable of being stored in a RAM of the memory 435 (e.g., during execution), a ROM of the memory 435 (e.g., on a generally permanent basis), or another non-transitory computer readable medium such as another memory or a disc. Software included in the implementation of the testing device 100/200 can be stored in the memory 435 of the controller 400. The software includes, for example, firmware, one or more applications, program data, filters, rules, one or more program modules, and other executable instructions. The controller 400 is operable or configured to retrieve from memory and execute, among other things, instructions related to the control processes and methods described herein. In other constructions, the controller 400 includes additional, fewer, or different components. In some embodiments, the controller 400 is implemented partially or entirely on a semiconductor (e.g., a field-programmable gate array ["FPGA"] semiconductor) chip, as an application specific integrated circuit ("ASIC"), or using only passive and active electrical and electronic components (e.g., without a processor).

The power supply module 415 supplies a nominal DC voltage to the controller 400 or other components or modules of the testing device 100/200/300. The power supply module 415 is also operable or configured to supply lower voltages to operate circuits and components within the controller 400 or testing device 100/200/300. In some embodiments, the controller 400 or other components and modules within the testing device 100/200/300 are powered by one or more batteries or battery packs. In other embodiments, the controller 400 or other components and modules within the testing device 100/200/300 are powered using power received through the AC test probe 125/225/325 or the USB test probe 130/230/330.

The user input module 410 is used to control the operation of the testing device 100/200. In some embodiments, the user input module 410 includes a combination of digital and analog input or output devices required to achieve a desired level of control and monitoring for the testing device 100/200/300. For example, the user interface module 410 can include a display, a touch-screen display, or one or more knobs, dials, switches, buttons, etc. In some implementations, the user interface module 410 is controlled in conjunction with the one or more indicators 405 (e.g., LEDs, speakers, etc.) to provide visual or auditory indications of the status or conditions of the testing device 100/200/300. In some embodiments, the user input module 410 includes the GFCI test button 135/235/335.

Figure 5:
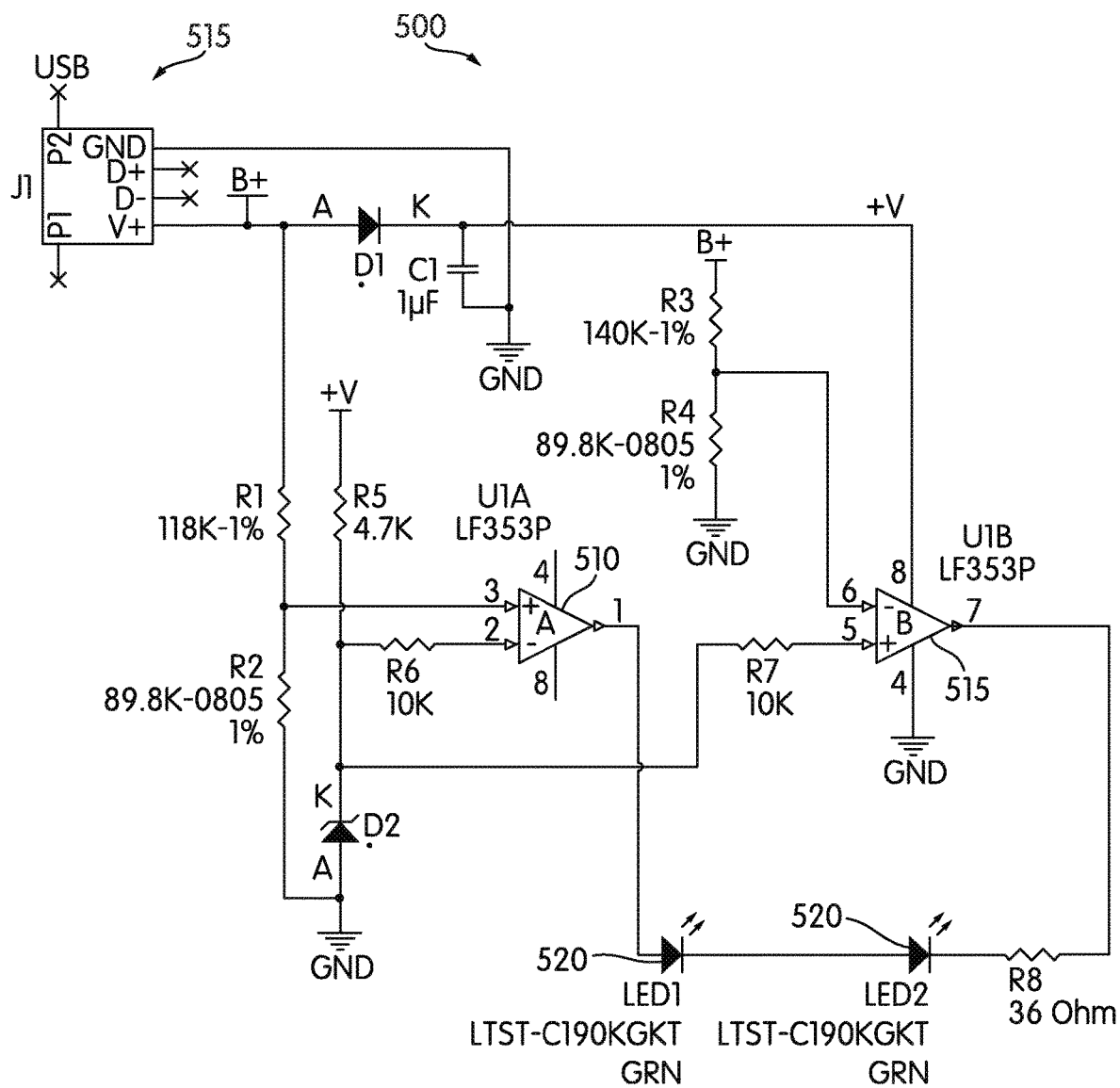
FIG. 5 is a circuit diagram of an AC testing circuit according to some embodiments of the invention.

FIG. 5 illustrates a circuit diagram of a USB test circuit 500 according to some embodiments of the invention. USB test circuit 500 includes an input 505, a first operational amplifier 510, a second operational amplifier 515, and one or more indicators 520. The input 505 is electrically connected to the USB test probe 130/230/330 and receives a USB voltage when the USB test probe 130/230/330 is plugged into a respective USB outlet. In operation, the first and second operational amplifiers 510, 515 are configured to receive the USB voltage and power the indicators 520 when the USB voltage is within a range. In some embodiments, the range is approximately 4.75V DC to approximately 5.25 V DC. If the USB voltage is outside the range (e.g., below approximately 4.75V DC or above approximately 5.25V DC), the indicators 520 are not powered. Such an embodiment does not require the use of an external power source (e.g., a battery). Rather, the illustrated embodiment powers the indicators 520 using the received USB voltage. In some embodiments, the resistance values of resistors R1-R7 and the breakdown voltage of Zener diode D2 may be changed in order to control the range value in which the indicators 520 are activated. In some embodiments, indicators 520 correspond to any one of the indicators 120 (FIGS. 1A & 1B), any one of the indicators 220 (FIGS. 2A & 2B), or indicator 320d (FIGS. 3A-3C).

Figure 6:
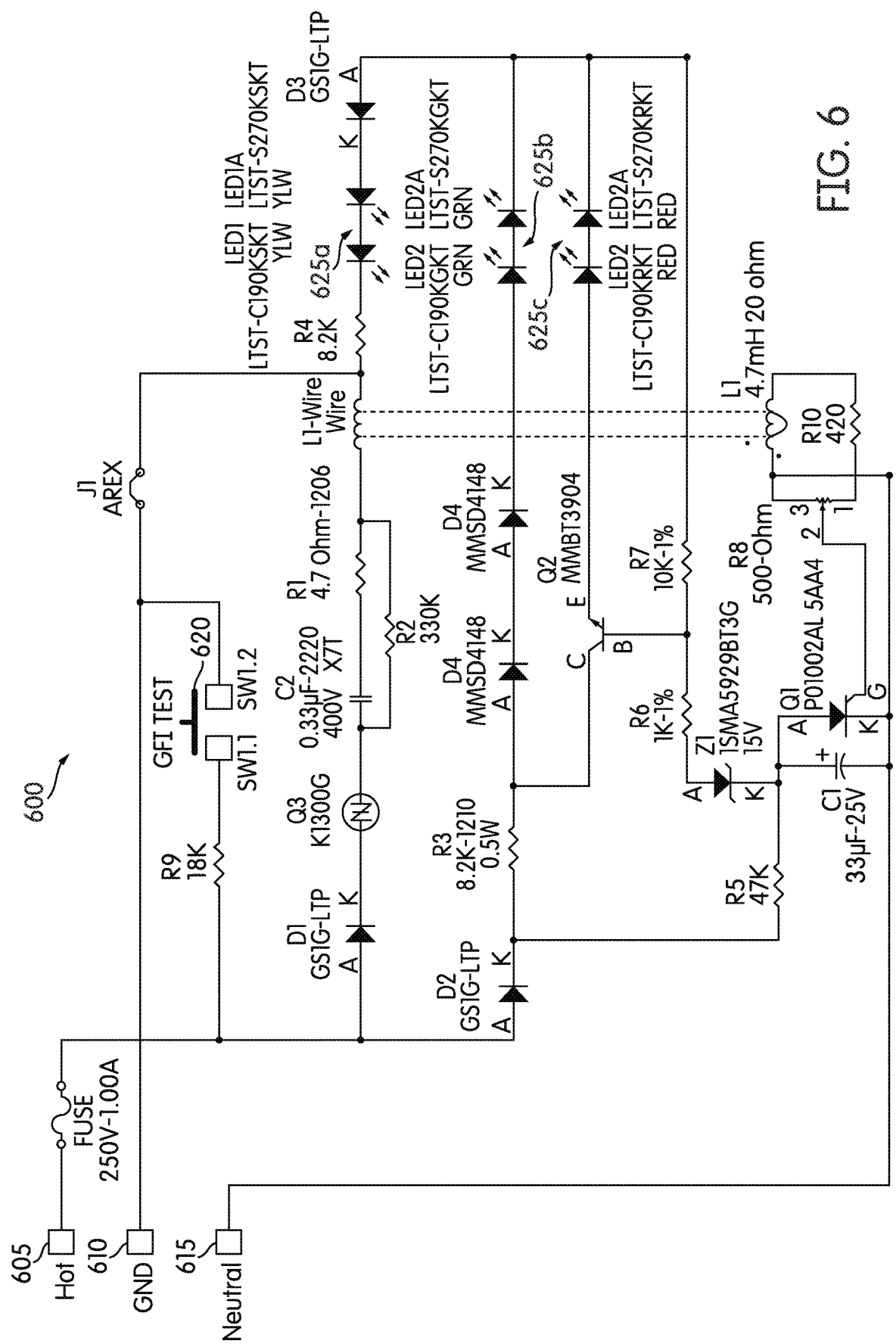
FIG. 6 is a circuit diagram of a USB testing circuit according to some embodiments of the invention.

FIG. 6 illustrates a circuit diagram of an AC test circuit 600 according to some embodiments of the invention. The AC test circuit 600 includes a hot, or positive, input 605, a ground input 610, a neutral input 615, a GFCI test switch 620, one or more indicators 625a, one or more indicators 625b, and one or more indicators 625c. In some embodiments, the positive input 605, the ground input 610, and the neutral input 615 correspond to the three prongs of the AC test probe 125/225/325. In some embodiments, the GFCI test switch 620 is activated by the user pressing the GFCI test button 135/235/335. In some embodiments, the indicators 625 correspond to indicators 120 (FIGS. 1A & 1B), any one of the indicators 220 (FIGS. 2A & 2B), or indicators 320a-320c (FIGS. 3A-3C).

In operation, the AC test circuit 600 is configured to perform a variety of tests. The tests may include, but are not limited to, one or more fault tests, a GFCI test, and a resistance test. The one or more fault tests may include, but are not limited to, an open ground, an open neutral, an open hot, a hot/ground reverse, and a hot/neutral reverse. In operation, the indicators 625 are activated accordingly to provide the user with an indication of the status of the electrical outlet and the detection of any faults.

The GFCI test simulates a ground fault in an electrical outlet, for example, a GFCI electrical outlet. To perform the GFCI test, the user presses the GFCI test button 135/235/335, which closes the GFCI test switch 620. Closing of the GFCI test switch 620 creates a closed circuit between the positive input 605 and the ground input 610, thus simulating a ground fault condition. If the electrical outlet is working properly, power to the electrical outlet will be shut off when the ground fault condition is detected, which will be indicated to the user via the indicators 625.

The resistance test is used to determine if there is a predetermined amount of resistance between the ground input 610 and the neutral input 615. In some embodiments, the predetermined resistance is approximately 7 ohms. If the resistance is equal to the predetermined amount of resistance, the indicators 625 are activated accordingly. If the resistance is not equal to the predetermined amount of resistance, the indicators 625 are activated accordingly.

Figure 7:
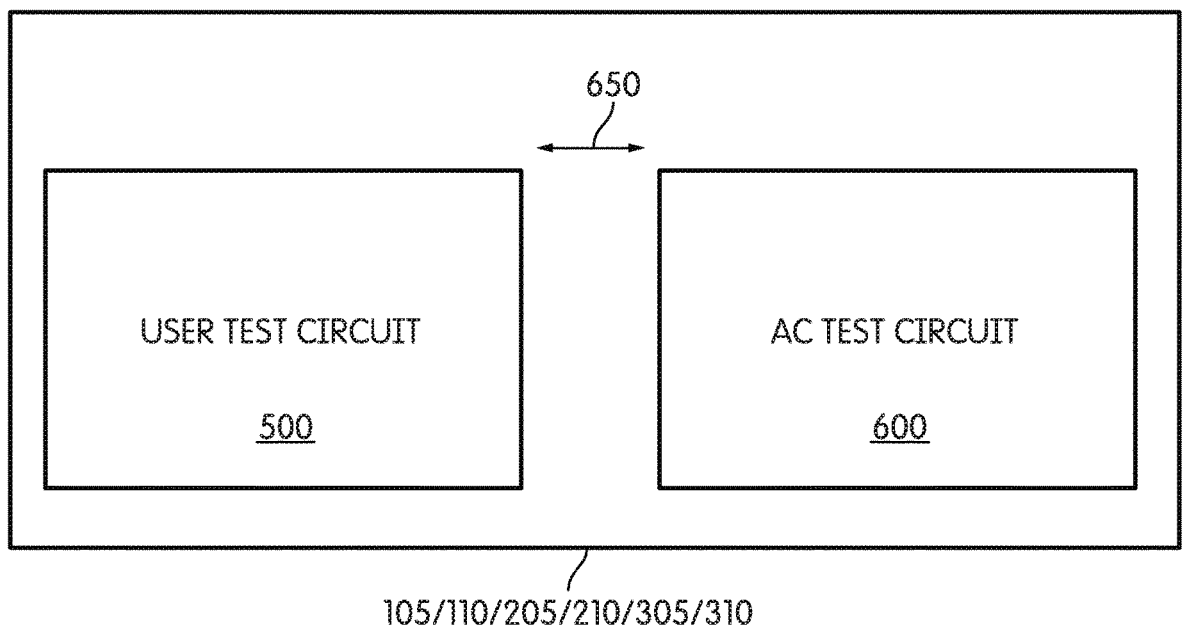
FIG. 7 is a block diagram illustrating the AC test circuit of FIG. 5 and the USB test circuit of FIG. 6 contained within a housing according to some embodiments of the invention.

FIG. 7 is a block diagram illustrating the USB test circuit 500 and the AC test circuit 600 contained within the main housing 105/205/305 and/or the probe housing 110/220/320. In some embodiments, the USB test circuit 500 and the AC test circuit 600 are galvanically isolated from each other by a physical separation 650. In such an embodiment, the physical separation may be at least approximately 8 mm.

Figure 8:
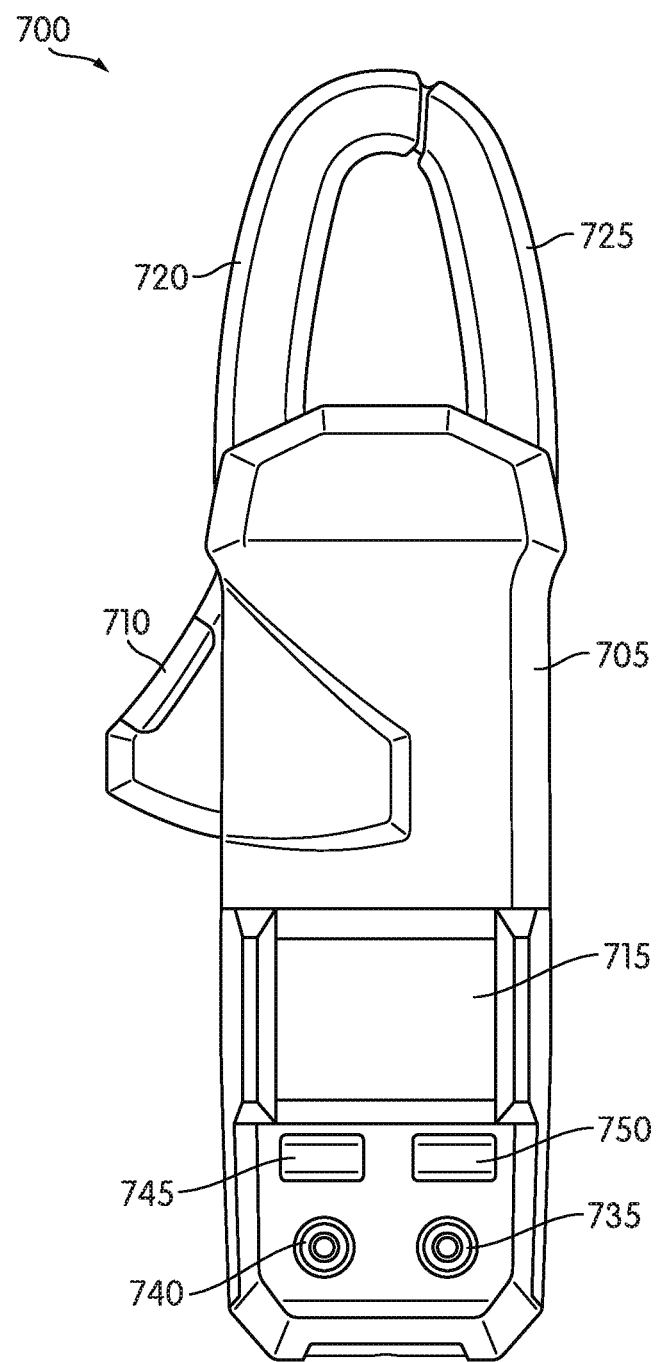
FIG. 8 illustrates a testing device according to another embodiment of the invention.

FIG. 8 illustrates a testing device 700 that includes a main body 705, a lever 710, a display 715, a first clamp portion 720, a second clamp portion 725, a wire receiving area 730, a positive input terminal 735, a negative input terminal 740, a power button 745, and a hold button 750. In some embodiments, testing device 700 is a clamp meter.

The testing device 700 is operable or configured to measure, for example, voltage, current, resistance, continuity, etc. Voltage, resistance, and continuity are measured using the positive input terminal 735 and the negative input terminal 740 (e.g., banana cables with probes attached to a distal end of the cables can be electrically connected to the positive input terminal 735 and the negative input terminal 740). The results of measurements are displayed on the display 715. The power button 745 is operable or configured to turn the testing device 700 on and off. The hold button 750 is operable or configured to hold a particular measurement on the display 715 (i.e., prevent a measurement from being updated with a new value).

The lever 710 is operable or configured to selectively open and close the first clamp portion 720 and the second clamp portion 725 such that the wire receiving area 730 is able to receive a conductor (e.g., a wire) for current measurement. In some embodiments, the lever 710 is connected to, or integral with, the first clamp portion 720, and the first clamp portion 720 is pivotable with respect to the second clamp portion 725 upon depression of the lever 710. In other embodiments, the depression of the lever 710 causes the first clamp portion 720 and the second clamp portion to be pivoted with respect to one another.

As shown in FIG. 8, the testing device 700 does not include a mode selection dial or buttons. Rather, the testing device 700 automatically selects a measurement mode based on, for example, an input at the positive terminal 735 and negative terminal 740, the depression of the lever 710, etc. In some embodiments, the testing device 700 operates to measure electrical parameters (e.g., voltage, current, resistance, continuity, etc.) in a manner similar to the clamp meter disclosed in U.S. Pat. No. 8,274,273, entitled "TEST AND MEASUREMENT DEVICE WITH A PISTOL-GRIP HANDLE," the entire content of which is hereby incorporated by reference.

Figure 9:
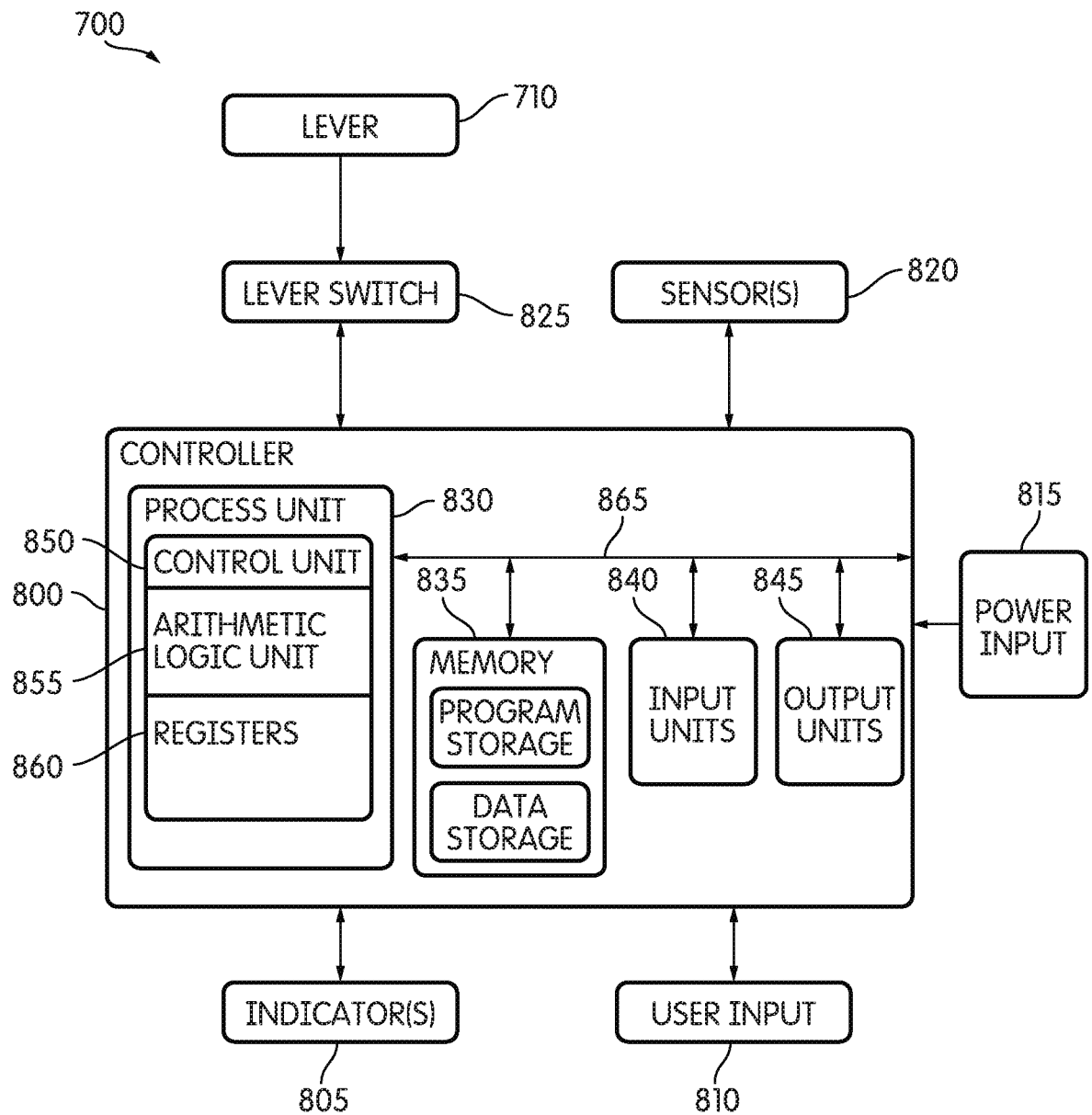
FIG. 9 illustrates a controller for the testing device of FIG. 8.

FIG. 9 illustrates a controller 800 associated with the testing device 700 of FIG. 8. The controller 800 is electrically and/or communicatively connected to a variety of modules or components of the testing device 700. For example, the illustrated controller 800 is connected to one or more indicators 805, a user input module 810, a power input module 815, one or more sensors 820, and a lever switch 825, which is, in turn, connected to the lever 710. The controller 800 includes combinations of hardware and software that are operable or configured to, among other things, control the operation of the testing device 700, activate the one or more indicators 805 (e.g., LEDs), etc. The sensors 820 are operable or configured to measure (or generate a signal related to) a variety of electrical parameters, or, in conjunction with the controller 800, perform a variety of tests related to the electrical parameters. For example, the sensors 820 can be used to measure voltage, current, resistance, etc. The sensors 820 can also be used in conjunction with the controller 800 to determine whether a voltage is present at the positive input terminal 735 and negative input terminal 740, whether continuity is present in a circuit, etc.

In some embodiments, the controller 800 includes a plurality of electrical and electronic components that provide power, operational control, and protection to the components and modules within the controller 800 and/or testing device 700. For example, the controller 800 includes, among other things, a processing unit 830 (e.g., a microprocessor, a microcontroller, or another suitable programmable device), a memory 835, input units 840, and output units 845. The processing unit 830 includes, among other things, a control unit 850, an arithmetic logic unit ("ALU") 855, and a plurality of registers 860 (shown as a group of registers in FIG. 9), and is implemented using a known computer architecture, such as a modified Harvard architecture, a von Neumann architecture, etc. The processing unit 830, the memory 835, the input units 840, and the output units 845, as well as the various modules connected to the controller 800 are connected by one or more control and/or data buses (e.g., common bus 865). The control and/or data buses are shown generally in FIG. 9 for illustrative purposes. The use of one or more control and/or data buses for the interconnection between and communication among the various modules and components would be known to a person skilled in the art in view of the invention described herein.

The memory 835 includes, for example, a program storage area and a data storage area. The program storage area and the data storage area can include combinations of different types of memory, such as read-only memory ("ROM"), random access memory ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, or electronic memory devices. The processing unit 830 is connected to the memory 835 and executes software instructions that are capable of being stored in a RAM of the memory 835 (e.g., during execution), a ROM of the memory 835 (e.g., on a generally permanent basis), or another non-transitory computer readable medium such as another memory or a disc. Software included in the implementation of the testing device 700 can be stored in the memory 835 of the controller 800. The software includes, for example, firmware, one or more applications, program data, filters, rules, one or more program modules, and other executable instructions. The controller 800 is operable or configured to retrieve from memory and execute, among other things, instructions related to the control processes and methods described herein. In other constructions, the controller 800 includes additional, fewer, or different components. In some embodiments, the controller 800 is implemented partially or entirely on a semiconductor (e.g., a field-programmable gate array ["FPGA"] semiconductor) chip, as an application specific integrated circuit ("ASIC"), or using only passive and active electrical and electronic components (e.g., without a processor).

The power input module 815 supplies a nominal DC voltage to the controller 800 or other components or modules of the testing device 700. The power input module 815 is also operable or configured to supply lower voltages to operate circuits and components within the controller 800 and/or testing device 700. In some embodiments, the controller 800 and/or other components and modules within the testing device 700 are powered by one or more batteries or battery packs.

The user input module 810 is used to control the testing device 700. For example, the user input module 810 is operably coupled to the controller 800 to control the testing device 700 and/or view the results of a measurement. The user input module 810 can include a combination of digital and analog input or output devices required to achieve a desired level of control for the testing device 700. For example, the user input module 810 can include input devices such as a touch-screen display, one or more knobs, dials, switches, buttons, etc. The display is, for example, a liquid crystal display ("LCD"), a light-emitting diode ("LED") display, an organic LED ("OLED") display, an electroluminescent display ("ELD"), a surface-conduction electron-emitter display ("SED"), a field emission display ("FED"), a thin-film transistor ("TFT") LCD, etc. In some embodiments, the user input module 810 is controlled in conjunction with the one or more indicators 805 (e.g., LEDs, speakers, etc.) to provide visual or auditory indications of the status or conditions of the testing device 700.

Figure 10:
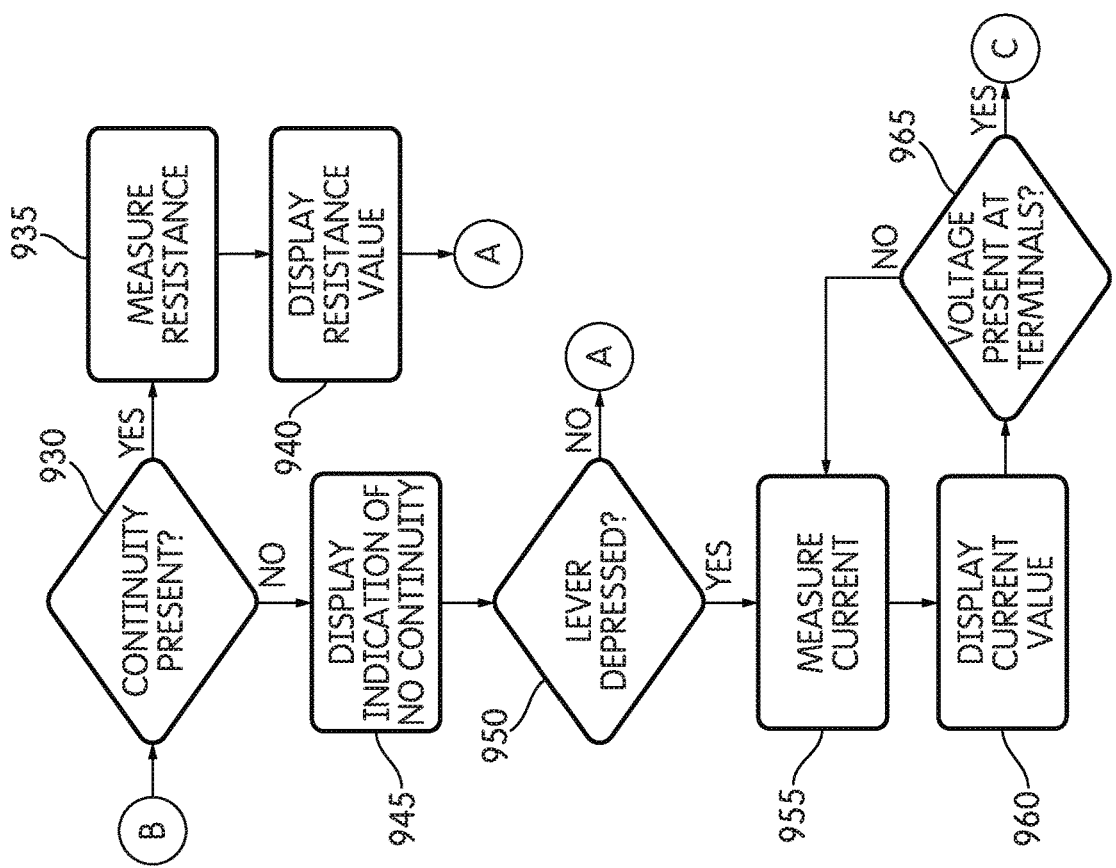
FIG. 10 is a process for operating the testing device of FIG. 8.
Figure 10:
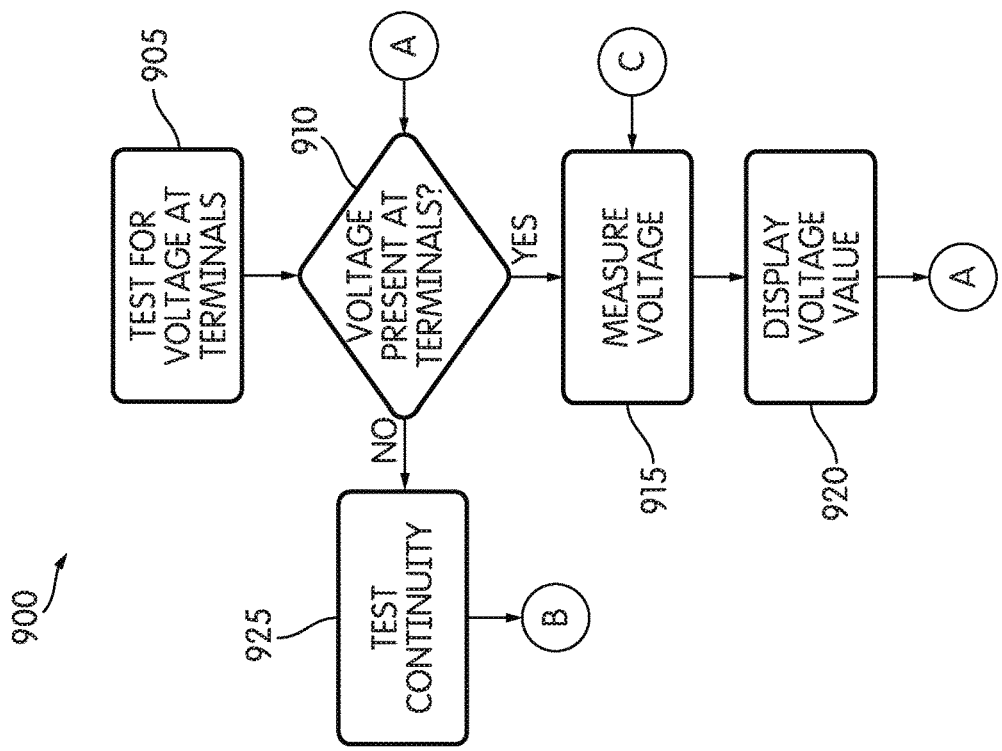

FIG. 10 is a process 900 for operating the testing device 700 according to an embodiment of the invention. Various steps described herein with respect to the process 900 are capable of being executed simultaneously, in parallel, or in an order that differs from the illustrated serial manner of execution. The process 900 is also capable of being executed using fewer steps than are shown in the illustrated embodiment.

When operating the testing device 700, the controller 800 first determines whether a voltage is present at the positive input terminal 735 and the negative input terminal 740 (step 905). If a voltage is present at step 10, the controller 800 measures the voltage between the positive input terminal 735 and the negative input terminal 740 (step 915). A value for the measured voltage is then displayed in the display 715 (step 920), and the process 900 returns to step 910 to again determine whether voltage is present at the positive input terminal 735 and the negative input terminal 740. In some embodiments, steps 910, 915, and 920 of process 900 are repeated as long as a voltage is present at the terminals 735 and 740.

If, at step 910, no voltage is present at the positive input terminal 735 and negative input terminal 740, the controller 800 performs a continuity test (step 925) for the circuit connected between the positive input terminal 735 and the negative input terminal 740. If continuity is present at step 930, the controller 800 measures a resistance of the circuit (step 935), and a value for the measured resistance is displayed on the display 715 (step 940). The process 900 then returns to step 910 to again determine whether voltage is present at the positive input terminal 735 and the negative input terminal 740.

If, at step 930, no continuity is present, an indication of no continuity is displayed on the display 715 (step 945), and the controller 800 determines whether the lever 710 has been depressed (step 950). The controller 800 determines whether the lever 710 has been depressed based on a signal received from the lever switch 825, which provides a signal to the controller to indicate that the lever 710 has been depressed. In some embodiments, the lever switch 825 constantly provides a signal to the controller 800 and only does not provide a signal to the controller 800 when the lever 710 is depressed. If the lever 710 has not been depressed at step 950, the process 300 returns to step 910 to again determine whether voltage is present at the positive input terminal 735 and the negative input terminal 740. If, at step 950, the lever 710 has been depressed, the controller 800 measures a current value using the first clamp portion 720 and the second clamp portion 725. If no wire or conductor is within the wire receiving area 730, no current is detected or measured. If a wire or conductor is within the wire receiving area 730 and conducting a current, the current is detected and measured. A value for the measured current is then displayed on the display 715 (step 960). After the value for the measured current is displayed on the display 715, the controller 800 again determines whether a voltage is present at the positive input terminal 735 and negative input terminal 740 (step 965). If no voltage is present, the controller 800 will continue to measure (step 955) and display (step 960) current using the first clamp portion 720 and the second clamp portion 725. If, at step 965, voltage is present at the positive input terminal 735 and the negative input terminal 740, the process 900 returns to step 915 and measures the voltage between the positive input terminal 735 and the negative input terminal 740.

Figure 11:
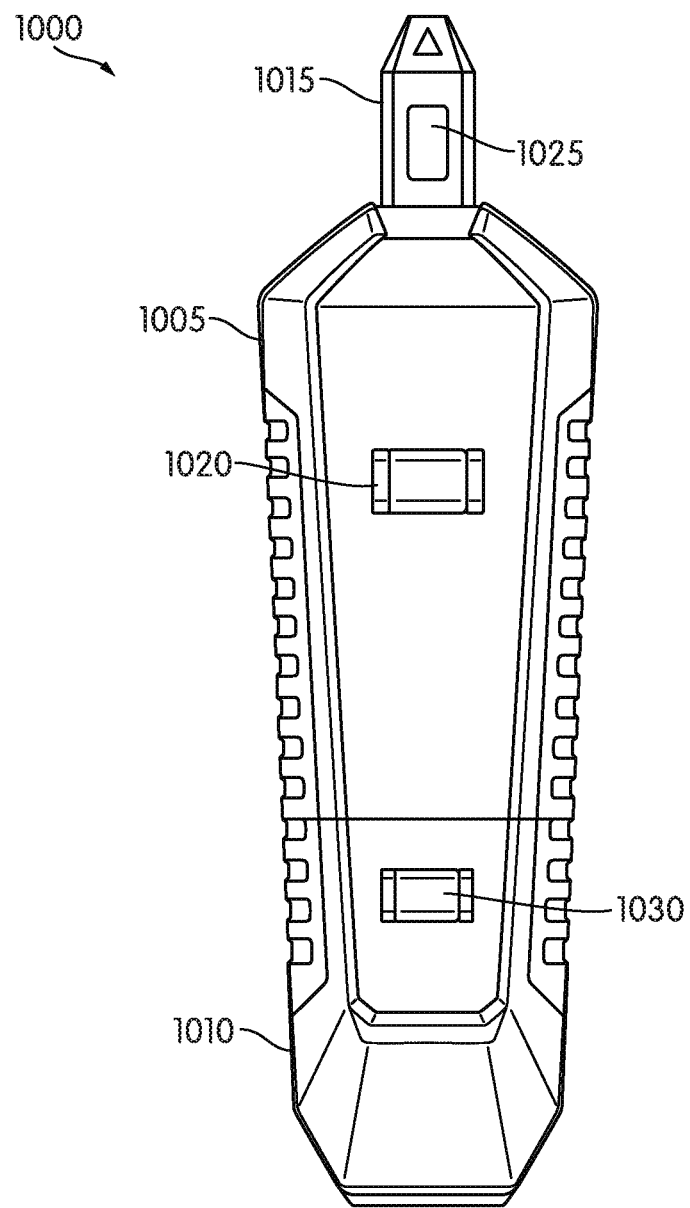
FIG. 11 illustrates a testing device according to another embodiment of the invention.

FIG. 11 illustrates a testing device 1000 that includes a receiver unit 1005, a transmitter unit 1010, a probe portion 1015, a power button 1020, an indicator 1025, and a ground fault circuit interrupter ("GFCI") test button 1030. In some embodiments, testing device 1000 is a circuit tracer.

Figure 12:
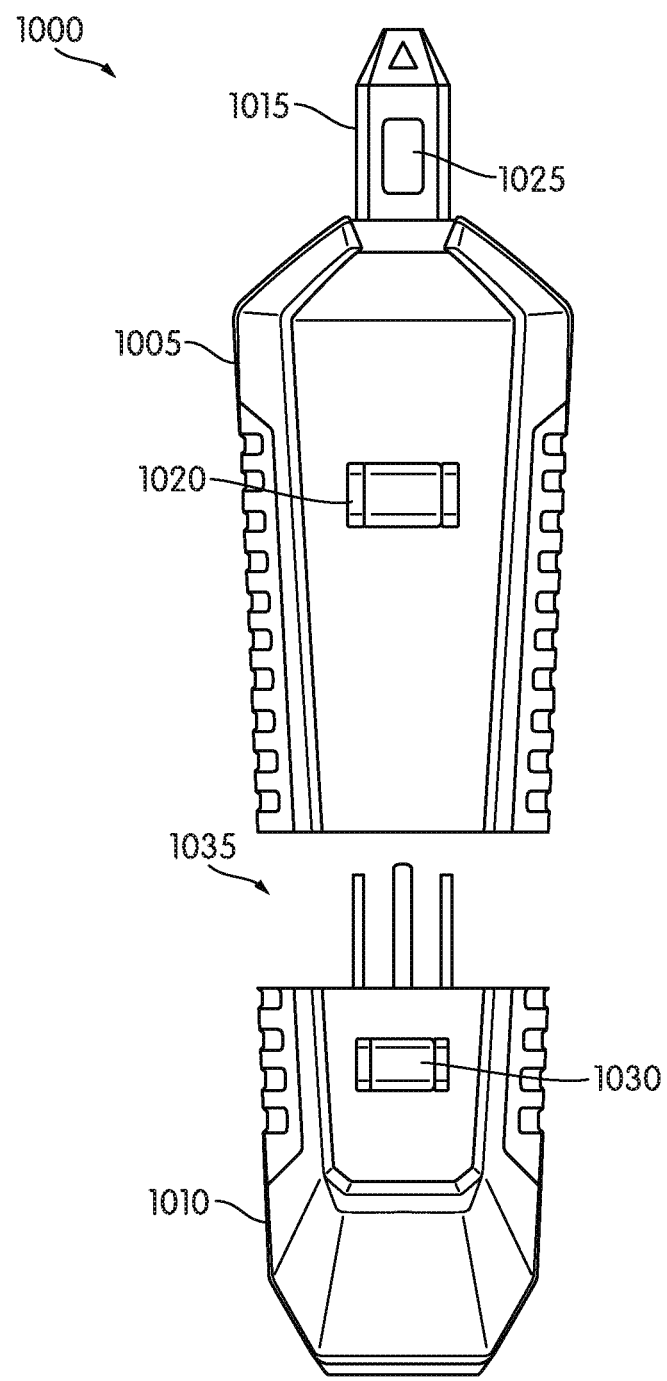
FIG. 12 illustrates the testing device of FIG. 11 with a transmitter unit and a receiver unit separated from one another.

As illustrated in FIG. 12, when the receiver unit 1005 is separated from the transmitter unit 1010, an AC test probe 1035 is accessible. In some embodiments, the transmitter unit 1010 is fitted with one or more accessories, such as a light bulb socket, a wire clip, etc., to allow the transmitter unit 1010 to test additional circuits. The receiver unit 1005 includes corresponding recesses for receiving the prongs of the AC test probe 1035 when the receiver unit and the transmitter unit 1010 are coupled to one another. The power button 1020 is operable or configured to selectively turn the circuit tracer on and off. In some embodiments, the power button causes both the receiver unit 1005 and the transmitter unit 1010 to enter an OFF state. In other embodiments, the power button 1020 causes the receiver unit 1005 to enter an off state, and the transmitter unit 1010 includes a second power button for causing the transmitter unit 1010 to enter an off state. The probe portion 1015 includes an antenna that allows the receiver unit to detect electrical signals (e.g., AC voltage signals). If the receiver unit 1005 detects an electrical signal (e.g., at a particular frequency, within a range of frequencies, with a non-zero frequency, etc.), the indicator 1025 is activated. In some embodiments, the indicator 1025 is an LED.

In some embodiments, when the AC test probe 1035 is inserted into an AC power outlet, the transmitter unit 1010 is also operable or configured to test for a variety of fault conditions associated with the outlet. The fault conditions include an open ground, an open neutral, an open hot, a hot/ground reverse, a hot neutral reverse, etc. The transmitter unit 1010 evaluates the outlet wiring to identify a fault condition. If a fault condition is identified, one or more indicators can be illuminated accordingly. For example, the one or more indicators are illuminated to indicate each type of potential fault. The indicators can also be illuminated to indicate that the outlet is wired properly and that no faults were identified. In some embodiments, the indicators can be accompanied by, or replaced with, an audible indicator that generates a tone (or sequence of tones) indicative of a detected fault condition. In some embodiments, the transmitter unit 1010 operates to test an AC power outlet in a manner similar to the outlet tester disclosed in U.S. Pat. No. 5,625,285, entitled "AC POWER OUTLET GROUND INTEGRITY AND WIRE TEST CIRCUIT DEVICE," the entire content of which is hereby incorporated by reference.

The GFCI test button 1030 is used to initiate a GFCI test. After ensuring that a powered outlet is wired properly, the AC test probe 1035 can be inserted into the GFCI outlet. A user can then activate the GFCI test button 1030. If a GFCI outlet is operating correctly, the GFCI test should cause the outlet to trip into an off state. In some embodiments, the transmitter unit 1010 operates to test a GFCI outlet in a manner similar to the outlet tester disclosed in U.S. Pat. No. 5,642,052, entitled "HAND-HELD TESTER FOR RECEPTACLE GROUND FAULT CIRCUIT INTERRUPTERS," the entire content of which is hereby incorporated by reference.

Figure 13:
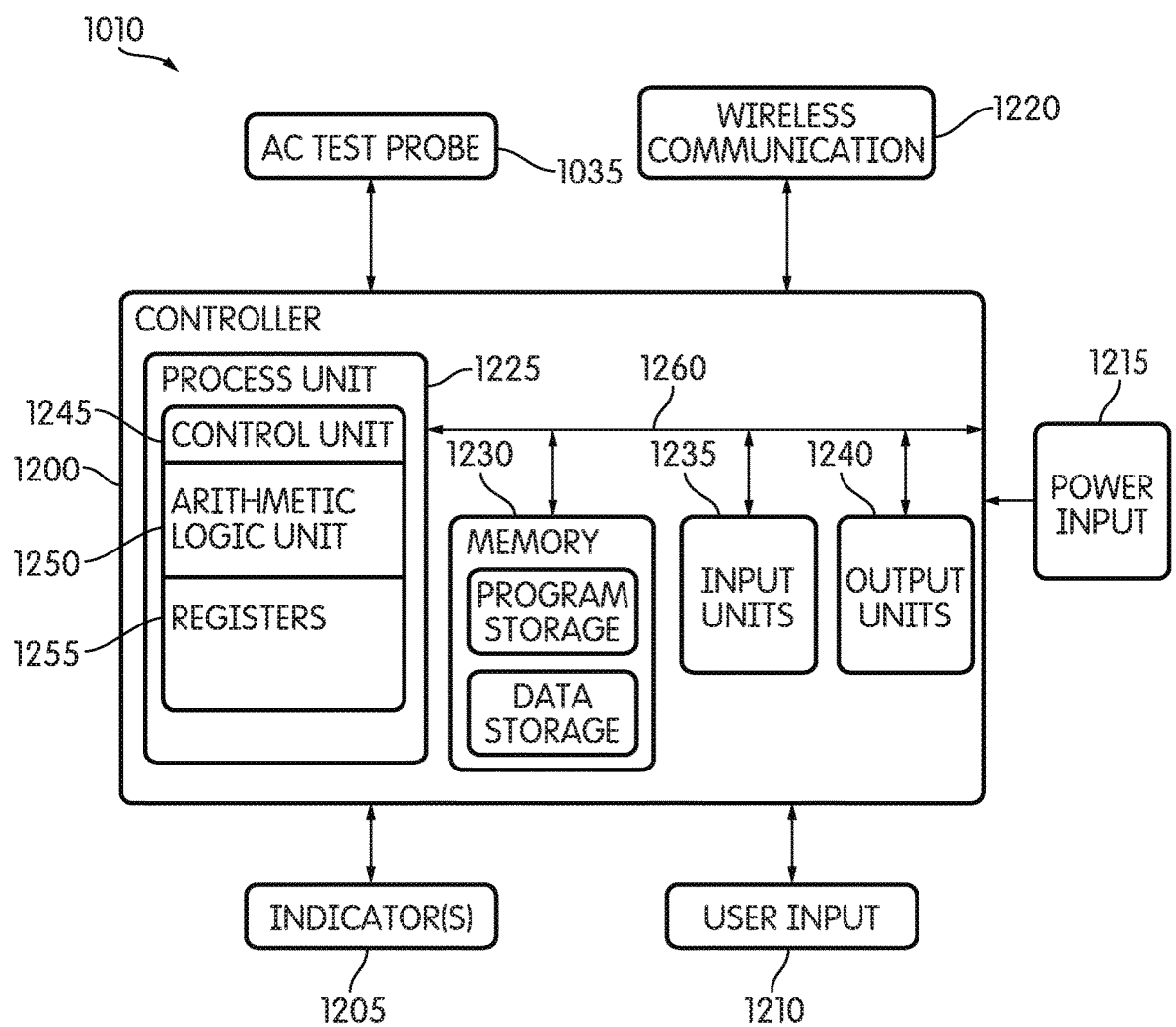
FIG. 13 illustrates a controller for the transmitter unit of FIG. 12 according to an embodiment of the invention.

FIG. 13 illustrates a controller 1200 associated with the transmitter unit 1010 of the testing device 1000. The controller 1200 is electrically and/or communicatively connected to a variety of modules or components of the transmitter unit 1010. For example, the illustrated controller 1200 is connected to one or more indicators 1205, a user input module 1210, a power input module 1215, the AC test probe 1035, and a wireless communication module 1220. The controller 1200 includes combinations of hardware and software that are operable or configured to, among other things, control the operation of the transmitter unit 1010, activate the one or more indicators (e.g., LEDs), etc.

In some embodiments, the controller 1200 includes a plurality of electrical and electronic components that provide power, operational control, and protection to the components and modules within the controller 1200 and/or transmitter unit 1010. For example, the controller 1200 includes, among other things, a processing unit 1225 (e.g., a microprocessor, a microcontroller, or another suitable programmable device), a memory 1230, input units 1235, and output units 1240. The processing unit 1225 includes, among other things, a control unit 1245, an arithmetic logic unit ("ALU") 1250, and a plurality of registers 1255 (shown as a group of registers in FIG. 13), and is implemented using a known computer architecture, such as a modified Harvard architecture, a von Neumann architecture, etc. The processing unit 1225, the memory 1230, the input units 1235, and the output units 1240, as well as the various modules connected to the controller 1200 are connected by one or more control and/or data buses (e.g., common bus 1260). The control and/or data buses are shown generally in FIG. 13 for illustrative purposes. The use of one or more control and/or data buses for the interconnection between and communication among the various modules and components would be known to a person skilled in the art in view of the invention described herein.

The memory 1230 includes, for example, a program storage area and a data storage area. The program storage area and the data storage area can include combinations of different types of memory, such as read-only memory ("ROM"), random access memory ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, or electronic memory devices. The processing unit 1225 is connected to the memory 1230 and executes software instructions that are capable of being stored in a RAM of the memory 1230 (e.g., during execution), a ROM of the memory 1230 (e.g., on a generally permanent basis), or another non-transitory computer readable medium such as another memory or a disc. Software included in the implementation of the transmitter unit 1010 can be stored in the memory 1230 of the controller 1200. The software includes, for example, firmware, one or more applications, program data, filters, rules, one or more program modules, and other executable instructions. The controller 1200 is configured to retrieve from memory and execute, among other things, instructions related to the control processes and methods described herein. In other embodiments, the controller 1200 includes additional, fewer, or different components. In some embodiments, the controller 1200 is implemented partially or entirely on a semiconductor (e.g., a field-programmable gate array ["FPGA"] semiconductor) chip, as an application specific integrated circuit ("ASIC"), or using only passive and active electrical and electronic components (e.g., without a processor).

The wireless communication module 1220 is operable or configured to connect to and communicate through a wireless network. In some embodiments, the network is, for example, a wide area network ("WAN") (e.g., a TCP/IP based network, a cellular network, such as, for example, a Global System for Mobile Communications ["GSM"] network, a General Packet Radio Service ["GPRS"] network, a Code Division Multiple Access ["CDMA"] network, an Evolution-Data Optimized ["EV-DO"] network, an Enhanced Data Rates for GSM Evolution ["EDGE"] network, a 3GSM network, a 4GSM network, a Digital Enhanced Cordless Telecommunications ["DECT"] network, a Digital AMPS ["IS-136/TDMA"] network, or an Integrated Digital Enhanced Network ["iDEN"] network, etc.). In other embodiments, the network is, for example, a local area network ("LAN"), a neighborhood area network ("NAN"), a home area network ("HAN"), or personal area network ("PAN") employing any of a variety of radio frequency ("RF") communications protocols, such as Wi-Fi, Bluetooth, ZigBee, etc.

The power input module 1215 supplies a nominal DC voltage to the controller 1200 or other components or modules of the transmitter unit 1010. The power input module 1215 is also configured to supply lower voltages to operate circuits and components within the controller 1200 or transmitter unit 1010. In some embodiments, the controller 1200 or other components and modules within the transmitter unit 1010 are powered by one or more batteries or battery packs. In other embodiments, the controller 1200 or other components and modules within the transmitter unit 1010 are powered using power received through the AC test probe 1035.

The user input module 1210 is used to control the operation of the transmitter unit 1010. In some embodiments, the user input module 1210 includes a combination of digital and analog input or output devices required to achieve a desired level of control and monitoring for the transmitter unit 1010. For example, the user input module 1210 can include a display, a touch-screen display, or one or more knobs, dials, switches, buttons, etc. In some implementations, the user input module 1210 is controlled in conjunction with the one or more indicators 1205 (e.g., LEDs, speakers, etc.) to provide visual or auditory indications of the status or conditions of the transmitter unit 1010.

Figure 14:
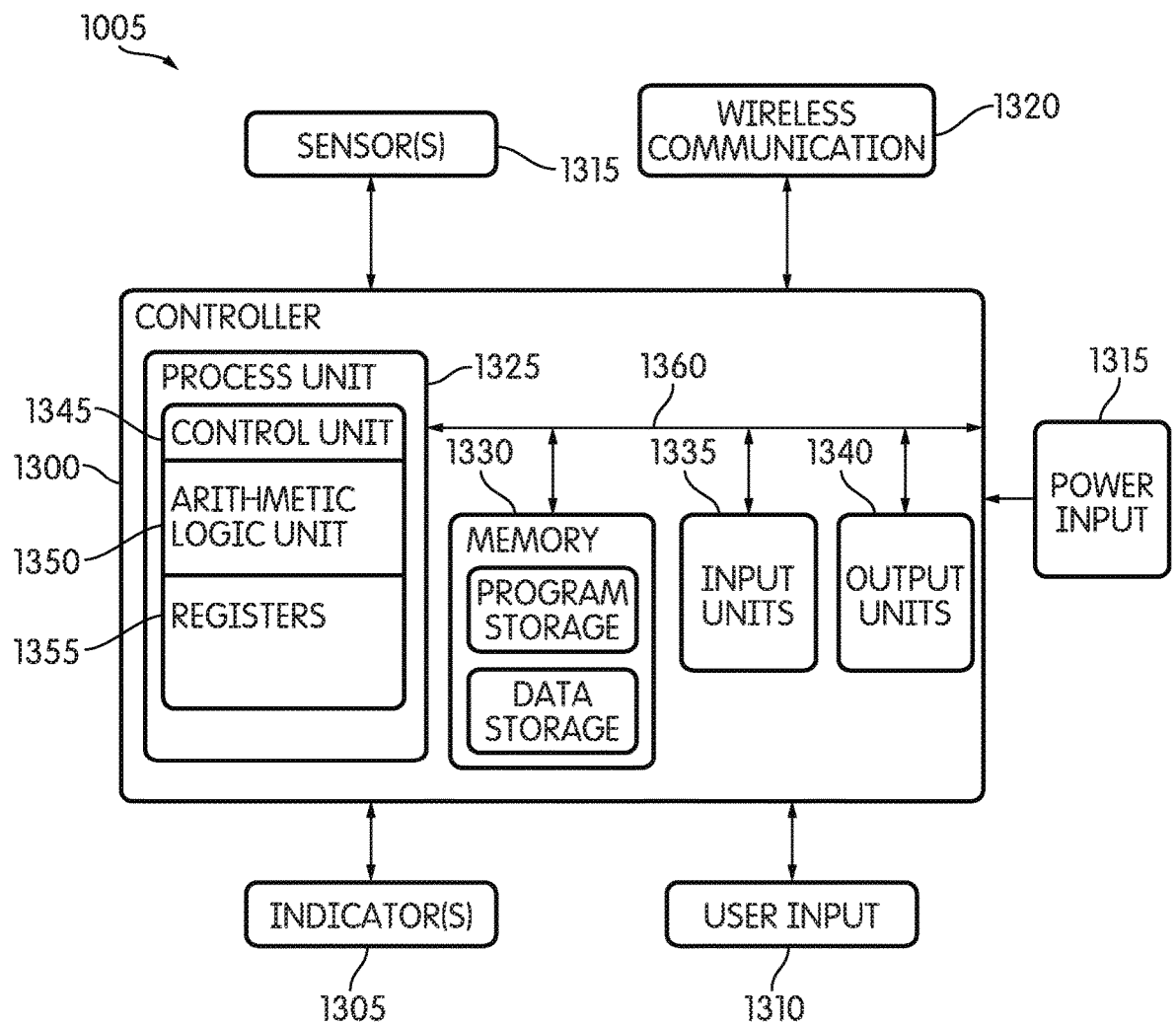
FIG. 14 illustrates a controller for the receiver unit of FIG. 12 according to an embodiment of the invention.

FIG. 14 illustrates a controller 1300 associated with the receiving unit 1005 of the testing device 1000. The controller 1300 is electrically and/or communicatively connected to a variety of modules or components of the receiving unit 1005. For example, the illustrated controller 1300 is connected to one or more indicators 1305, a user input module 1310, a power input module 1315, one or more sensors 1315 (e.g., one or more antennas, etc.), and a wireless communications module 1320. The controller 1300 includes combinations of hardware and software that are operable or configured to, among other things, control the operation of the receiving unit 1005, activate the one or more indicators 1305 (e.g., LEDs, etc.). The wireless communication module 1320 communicatively connects to the wireless communication module 1220 over a network such as one of the networks previously described.

In some embodiments, the controller 1300 includes a plurality of electrical and electronic components that provide power, operational control, and protection to the components and modules within the controller 1300 and/or receiving unit 1005. For example, the controller 1300 includes, among other things, a processing unit 1325 (e.g., a microprocessor, a microcontroller, or another suitable programmable device), a memory 1330, input units 1335, and output units 1340. The processing unit 1325 includes, among other things, a control unit 1345, an arithmetic logic unit ("ALU") 1350, and a plurality of registers 1355 (shown as a group of registers in FIG. 14), and is implemented using a known computer architecture, such as a modified Harvard architecture, a von Neumann architecture, etc. The processing unit 1325, the memory 1330, the input units 1335, and the output units 1340, as well as the various modules connected to the controller 1300 are connected by one or more control and/or data buses (e.g., common bus 1360). The control and/or data buses are shown generally in FIG. 14 for illustrative purposes. The use of one or more control and/or data buses for the interconnection between and communication among the various modules and components would be known to a person skilled in the art in view of the invention described herein.

The memory 1330 includes, for example, a program storage area and a data storage area. The program storage area and the data storage area can include combinations of different types of memory, such as read-only memory ("ROM"), random access memory ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, or electronic memory devices. The processing unit 1325 is connected to the memory 1330 and executes software instructions that are capable of being stored in a RAM of the memory 1330 (e.g., during execution), a ROM of the memory 1330 (e.g., on a generally permanent basis), or another non-transitory computer readable medium such as another memory or a disc. Software included in the implementation of the receiving unit can be stored in the memory 1330 of the controller 1300. The software includes, for example, firmware, one or more applications, program data, filters, rules, one or more program modules, and other executable instructions. The controller 1300 is configured to retrieve from memory and execute, among other things, instructions related to the control processes and methods described herein. In other embodiments, the controller 1300 includes additional, fewer, or different components. In some embodiments, the controller 1300 is implemented partially or entirely on a semiconductor (e.g., a field-programmable gate array ["FPGA"] semiconductor) chip, as an application specific integrated circuit ("ASIC"), or using only passive and active electrical and electronic components (e.g., without a processor).

The power input module 1315 supplies a nominal DC voltage to the controller 1300 or other components or modules of the receiving unit 1005. The power supply module 1315 is also configured to supply lower voltages to operate circuits and components within the controller 1300 or receiving unit 1005. In other constructions, the controller 1300 or other components and modules within the receiving unit 1005 are powered by one or more batteries or battery packs.

The user input module 1310 is used to control the operation of the receiving unit 1005. In some embodiments, the user input module 1310 includes a combination of digital and analog input or output devices required to achieve a desired level of control and monitoring for the receiving unit 1005. For example, the user interface module 1310 can include a display, a touch-screen display, or one or more knobs, dials, switches, buttons, etc. In some implementations, the user interface module 1310 is controlled in conjunction with the one or more indicators 1305 (e.g., LEDs, speakers, etc.) to provide visual or auditory indications of the status or conditions of the receiving unit 1005.

Figure 15:
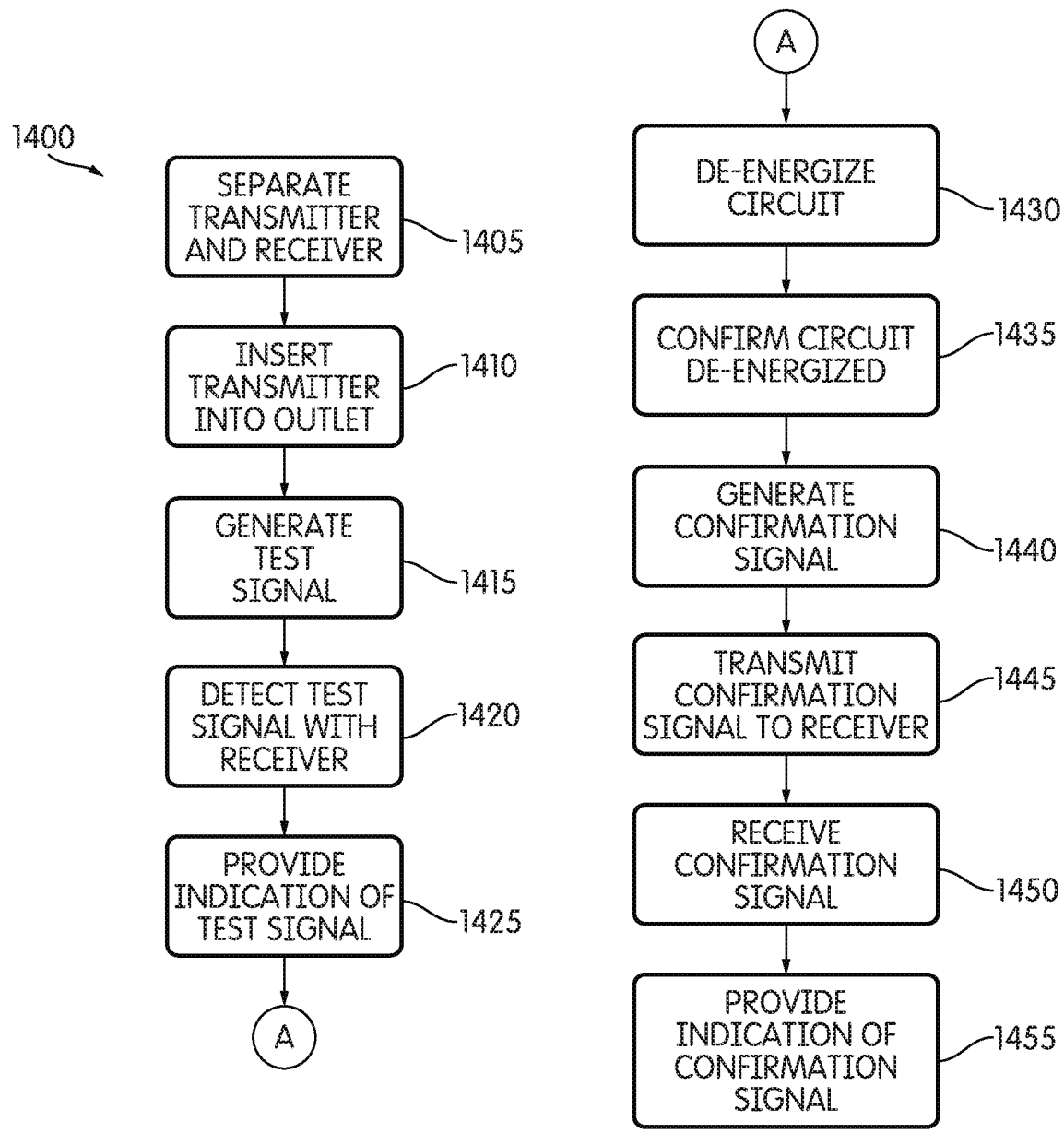
FIG. 15 is a process for operating the testing device of FIG. 11.

FIG. 15 is a process 1400 for operating the testing device 1000. At step 1405, the receiver unit 1005 and the transmitter unit 1010 are separated from one another to expose the AC test probe 1035. The AC test probe 1035 of the transmitter unit 1010 is inserted into an AC power outlet (step 1410). The transmitter unit 1010 generates a test signal that is transmitted down a power line from the AC power outlet to a circuit breaker (step 1415). The receiver unit 1005 is used to detect the test signal at or near the circuit breaker (step 1420). Specifically, the test signal generated by the transmitter unit 1010 is generated at a specific frequency or at a frequency within a limited range of frequencies. The probe 1015 and the controller 1300 of the receiver unit 1005 are operable or configured to detect the test signal at the specific frequency or within the range of frequencies. When the receiver unit 1005 detects the test signal at step 1420, the indicator 1025 is illuminated to provide an indication to the user that the signal was detected (step 1425).

When detecting the test signal, the indicator 1025 may indicate that the test signal is being detected within the vicinity of, for example, two or three circuit breakers (i.e., as opposed to a single circuit breaker). As a result, there can be uncertainty regarding which of the circuit breakers needs to be tripped in order to de-energize the outlet. A trial-and-error approach will result in the proper circuit breaker being tripped and the AC power outlet's circuit being de-energized (step 1430). Upon de-energization of the AC power outlet's circuit, the transmitter unit 1010 stops transmitting the test signal, the receiver unit 1005 stops receiving the test signal, and the indicator 1025 is deactivated to indicate that the test signal has ceased.

After the circuit is de-energized at step 1430, the user verifies whether the AC power outlet's circuit has, in fact, been de-energized. For example, if the receiver unit 1005 stopped detecting the test signal for a different reason (e.g., faulty sensor readings), the AC power outlet could still be energized. As such, at step 1435, the transmitter unit 1010 confirms that the AC power outlet's circuit has been de-energized by trying to detect a voltage at the outlet. If no voltage is detected at the outlet, the transmitter 1010 confirms that the circuit has been de-energized. The transmitter unit 1010 then generates a confirmation signal (step 1440) and transmits the confirmation signal to the receiver unit 1005 over a wireless network, such as one of the wireless networks previously described (step 1445). The receiver unit 1005 receives the confirmation signal from the transmitter unit 1010 (step 1450) and provides an indication to the user that the AC power outlet's circuit has been de-energized (step 1455). In some embodiments, the indication is a sequence of activations and deactivations of the indicator 1025.

In some embodiments of the process 1400, the transmitter unit 1010 continually sends signals to the receiver unit 1005 over the wireless communication link while generating the test signal. When the outlet's circuit is de-energized, the test signal and the signals sent over the wireless communication link cease, and the receiver unit 1005 can provide an indication that the outlet has been de-energized. In some embodiments, the receiver unit 1005 includes safety features to ensure that the receiver unit is not out of range of the transmitter unit 1010, which could mimic the results of the de-energization of an outlet. For example, the receiver unit 1005 can transmit a signal to the transmitter unit 1010 requesting a response to confirm a communication link. The receiver unit 1005 can also monitor the signal strength of signals received from the transmitter unit 1010. If the signal strength is weak or weakening prior to the cessation of signals from the transmitter unit 1010, the receiver unit 1005 can indicate that it may be out of range of the transmitter unit 1010.

Thus, the invention provides, among other things, a testing device for testing a receptacle, an outlet, and/or a wire. Various features and advantages of the invention are set forth in the following claims.

What is claimed is:

1. A hand-held testing device comprising:
 a main housing configured to be gripped by a user, wherein the main housing includes at least one indicator;
 a rotatable probe housing rotatably coupled to the main housing;
 a first test probe coupled to the main housing, the first test probe being configured to be inserted into an alternating-current (AC) receptacle to test the AC receptacle for a fault condition associated with the AC receptacle; and a second test probe coupled to the rotatable probe housing, the second test probe being configured to be inserted into a universal serial bus (USB) receptacle to test the USB receptacle for a fault condition associated with the USB receptacle.

2. The hand-held testing device of claim 1, further comprising:
a first test circuit located at least partially within the main housing, the first test circuit being electrically coupled to the first test probe and configured to
receive, via the first test probe, an AC voltage from the AC receptacle,
perform a first test on the AC voltage, and
output a first signal to the at least one indicator based on the first test.

3. The hand-held testing device of claim 2, wherein the first test includes at least one selected from a group consisting of an open ground fault test, an open hot fault test, an open neutral fault test, and a reversed wire fault test.

4. The hand-held testing device of claim 1, further comprising:
a second test circuit located at least partially within the rotatable probe housing, the second test circuit being electrically coupled to the second test probe and configured to
receive, via the second test probe, the USB voltage from the USB receptacle,
perform a second test on the USB voltage, and
output a second signal to the at least one indicator based on the second test.

5. The hand-held testing device of claim 4, wherein the second test includes determining that the USB voltage is within a range.

6. The hand-held testing device of claim 5, wherein the range is approximately 4.75 volts to approximately 5.25 volts.

7. The hand-held testing device of claim 1, further comprising a first test circuit and a second test circuit, the first test circuit and the second test circuit being galvanically isolated.

8. The hand-held testing device of claim 1, wherein the rotatable probe housing includes an indicator.

9. The hand-held testing device of claim 1, further comprising a ground fault circuit interrupter (GFCI) user-interface.

10. The hand-held testing device of claim 9, further comprising: a first test circuit located at least partially within the main housing, the first test circuit being electrically coupled to the first test probe and configured to, upon activation of the GFCI user-interface, perform a GFCI test on the AC receptacle.

11. The hand-held testing device of claim 1, further comprising a test button mounted on the main housing, wherein the test button is configured to initiate a test via at least one of the first test probe or the second test probe.

12. The hand-held testing device of claim 1, wherein
the at least one indicator includes an AC test indicator and a USB test indicator,
the AC test indicator is configured to output a first indication based on an AC test signal transmitted from the first test probe, and
the USB test indicator is configured to output a second indication based on a USB test signal received from the second test probe.

13. A method of testing an alternating-current (AC) voltage and a universal serial bus (USB) voltage, the method comprising:
providing a main housing having at least one indicator and that is configured to be gripped by a user, and a rotatable probe housing rotatably coupled to the main housing;
receiving, via a first test probe coupled to the main housing and configured to be inserted into an AC receptacle to test the AC receptacle for a fault condition associated with the AC receptacle, an AC voltage; and
receiving, via a second test probe coupled to the probe housing and configured to be inserted into a USB receptacle to test the USB receptacle for a fault condition associated with the USB receptacle, a USB voltage.

14. The method of claim 13, further comprising:
performing, via a first test circuit located at least partially in the main housing, a first test on the (AC) voltage; and
outputting, to the at least one indicator, a first signal based on the first test.

15. The method of claim 14, wherein the performing the first test on the (AC) voltage includes performing at least one selected from a group consisting of an open ground fault test, an open hot fault test, an open neutral fault test, and a reversed wire fault test.

16. The method of claim 13, further comprising:
performing, via a second test circuit located at least partially in the rotatable probe housing, a second test on the USB voltage; and
outputting, to the at least one indicator, a second signal based on the second test.

17. The method of claim 16, wherein the performing the second test on the USB voltage includes determining that the USB voltage is within a range.

18. The method of claim 17, wherein the range is between approximately 4.75 volts to approximately 5.25 volts.

19. The method of claim 13, further comprising:
performing, via a first test circuit, a first test; and
performing, via a second test circuit, a second test.

20. The method of claim 19, wherein the first test circuit and the second test circuit are galvanically isolated.

* * * * *